United States Patent
Fujimori

(10) Patent No.: US 7,428,565 B2
(45) Date of Patent: Sep. 23, 2008

(54) LOGICAL OPERATION CIRCUIT AND LOGICAL OPERATION DEVICE

(75) Inventor: Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 785 days.

(21) Appl. No.: 10/889,402

(22) Filed: Jul. 12, 2004

(65) Prior Publication Data

US 2005/0017757 A1    Jan. 27, 2005

(30) Foreign Application Priority Data

Jul. 25, 2003 (JP) .............................. 2003-280520

(51) Int. Cl.
    G06F 7/38       (2006.01)
(52) U.S. Cl. ........................ 708/490; 236/38
(58) Field of Classification Search .............. 708/490, 708/702; 326/38
    See application file for complete search history.

(56) References Cited

U.S. PATENT DOCUMENTS 5,896,042 A * 4/1999 Nishimura et al. ............. 326/38
6,924,663 B2 * 8/2005 Masui et al. ................... 326/38
2003/0169071 A1 * 9/2003 Nozawa et al. ................ 326/38
2005/0146922 A1 * 7/2005 Kameyama et al. ......... 365/154

FOREIGN PATENT DOCUMENTS

JP    2000-299000    10/2000
JP    2002157877     5/2002

* cited by examiner

Primary Examiner—Chuong D Ngo
(74) Attorney, Agent, or Firm—Hogan & Hartson LLP

(57) ABSTRACT

To provide a logical operation circuit and a logical operation device which can performs a logical operation using a ferroelectric capacitor. The area ratio between the ferroelectric capacitors CF1 and CF2 are set such that the potential difference Vdef between voltages Va1 and Va0 is as large as possible, and a transistor MP has a threshold voltage Vth which is about ½·(Va0+Va1). Thus, the ON/OFF operation margin of the transistor MP can be significantly large. As a result, a reading process can be performed at a high speed without using an amplifying circuit such as a sense amplifier. Also, the logical operation circuit and the logical operation device can be highly integrated with ease since no sense amplifier is used.

27 Claims, 18 Drawing Sheets

Fig. 7A

| y1 | y2 | ML |
|---|---|---|
| 0 (BY1="L") | 0 (BY2="L") | 1 (MP=OFF) |
| 0 (BY1="L") | 1 (BY2="H") | 1 (MP=OFF) |
| 1 (BY1="H") | 0 (BY2="L") | 0 (MP=ON) |
| 1 (BY1="H") | 1 (BY2="H") | 1 (MP=OFF) |

Fig. 7B

| y1 | y2 | ML |
|---|---|---|
| 0 (BY1="L") | 0 (BY2="L") | 0 (MP=ON) |
| 0 (BY1="L") | 1 (BY2="H") | 1 (MP=OFF) |
| 1 (BY1="H") | 0 (BY2="L") | 0 (MP=ON) |
| 1 (BY1="H") | 1 (BY2="H") | 0 (MP=ON) |

Fig. 18

| | C1/C0 | RL | RU |
|---|---|---|---|
| B=0.9 | 4 | 1.0 | 3.9 |
| | 3 | 0.9 | 3.3 |
| | 2 | 0.8 | 2.7 |
| B=0.8 | 4 | 0.7 | 5.6 |
| | 3 | 0.7 | 4.6 |
| | 2 | 0.6 | 3.8 |
| B=0.75 | 4 | 0.6 | 6.4 |
| | 3 | 0.6 | 5.4 |
| | 2 | 0.5 | 4.4 |

US 7,428,565 B2

LOGICAL OPERATION CIRCUIT AND LOGICAL OPERATION DEVICE

CROSS-REFERENCE TO RELATED APPLICATION

The entire disclosure of Japanese Patent Application No. 2003-280520 filed on Jul. 25, 2003 including their specification, claims, drawings and summary are incorporated herein by reference in its entirety.

BACKGROUND OF THE INVENTION

1. Field of the Invention

This invention relates to a logical operation circuit and a logical operation device and, more particularly, to a logical operation circuit and a logical operation device using a ferroelectric capacitor.

2. Description of a Prior Art

A non-volatile memory is known as a circuit using a ferroelectric capacitor (see JP-A-2000-299000, for example). It is possible to realize a rewritable non-volatile memory which can operate on a low voltage by using a ferroelectric capacitor.

However, such a conventional circuit cannot perform a logical operation on data even if it can store data.

SUMMARY OF THE INVENTION

An object of this invention is to solve the problem of such a conventional circuit using a ferroelectric capacitor and to provide a logical operation circuit and a logical operation device which can perform a logical operation on data using a ferroelectric capacitor.

This invention provides a logical operation circuit comprising: a first ferroelectric capacitor which can retain a polarization state corresponding to a specified logical operator and which has first and second terminals; first and second signal lines which can provide first and second operation target data to the first and second terminals, respectively, of the first ferroelectric capacitor retaining the polarization state corresponding to the specified logical operator and which are connected to the first and second terminals, respectively; and an operation result output section which, when the residual polarization state of the first ferroelectric capacitor determined by the provision of the two operation target data is either a first residual polarization state or a second residual polarization state having a polarization direction opposite that of the first residual polarization state, outputs the result of a logical operation performed on the first and second operation target data according to the logical operator based on the residual polarization state of the first ferroelectric capacitor, which has a second ferroelectric capacitor having a third terminal connected to the first signal line and a fourth terminal connected to a first reference potential, and which, when outputting the logical operation result, connects the first and second signal lines to the first reference potential and releases the connection, then connects the second signal line to a second reference potential, and outputs the logical operation result based on a potential generated in the first signal line when the second signal line is connected to the second reference potential. The area ratio Ra of the area of the second ferroelectric capacitor to the area of the first ferroelectric capacitor satisfies the following relation:

$$1/(1+C0/C1\cdot Ra)-1/(1+Ra) \geq 0.75\cdot(1/(1+\sqrt{(C0/C1)})-1/(1+\sqrt{(C1/C0)}))$$

wherein

C0: the first ferroelectric capacitor's average capacitance at the time of non-inversion, and C1: the first ferroelectric capacitor's average capacitance at the time of inversion.

This invention provides a logical operation circuit comprising: a first ferroelectric capacitor which retains a residual polarization state corresponding to a specified logical operator and which has first and second terminals; and an operation result output section which, based on a polarization state of the first ferroelectric capacitor obtained by providing first and second operation target binary data y1 and y2 to first and second terminals, respectively, of the first ferroelectric capacitor, outputs the result of a logical operation performed on the first and second operation target data y1 and y2 according to the logical operator as operation result binary data "z", which has a second ferroelectric capacitor having a third terminal connected to the first terminal and a fourth terminal connected to a first reference potential, and which, when outputting the logical operation result, connects the first to third terminals to the first reference potential and releases the connection, then connects the second terminal to a second reference potential, and outputs the logical operation result based on a potential generated in the first and third terminals when the second terminal is connected to the second reference potential. The area ratio Ra of the area of the second ferroelectric capacitor to the area of the first ferroelectric capacitor satisfies the following relation:

$$1/(1+C0/C1\cdot Ra)-1/(1+Ra) \geq 0.75\cdot(1/(1+\sqrt{(C0/C1)})-1/(1+\sqrt{(C1/C0)}))$$

wherein

C0: the first ferroelectric capacitor's average capacitance at the time of non-inversion, and C1: the first ferroelectric capacitor's average capacitance at the time of inversion.

In the logical operation circuit, when the residual polarization state of the first ferroelectric capacitor corresponding to the specified logical operator is represented by state binary data "s", the operation result data "z" substantially satisfies the following relation:

$$z = /s \text{ AND } y1 \text{ NAND } /y2 \text{ OR } s \text{ AND } (y1 \text{ NOR } /y2).$$

This invention provides a logical operation circuit comprising: a first ferroelectric capacitor having first and second terminals; and a second ferroelectric capacitor having a third terminal connected to the first terminal and a fourth terminal connected to a first reference potential, in which the first and second ferroelectric capacitors are precharged to the first reference potential and then the fourth and second terminals are connected to the first reference potential and a second reference potential, respectively, so that a logical operation result corresponding to the history of the voltage applied to the first and second terminals before the precharging can be outputted based on a potential generated at the first and third terminals connected to each other when the fourth and second terminals are connected to the first and second reference potentials, respectively, and in which the ratio R of the second ferroelectric capacitor's average capacitance at the time of non-inversion to the first ferroelectric capacitor's average capacitance at the time of non-inversion satisfies the following relation:

$$1/(1+C0/C1\cdot R)-1/(1+R) \geq 0.75\cdot(1/(1+\sqrt{(C0/C1)})-1/(1+\sqrt{(C1/C0)}))$$

wherein
C0: the first ferroelectric capacitor's average capacitance at the time of non-inversion, and C1: the first ferroelectric capacitor's average capacitance at the time of inversion.

Although the features of this invention can be expressed as above in a broad sense, the constitution and content of this invention, as well as the object and features thereof, will be apparent with reference to the following disclosure, taken in connection with the accompanying drawings.

BRIEF DESCRIPTION OF THE DRAWINGS

FIG. 7A is a table showing the relation among first and second operation target data y1 and y2 and the value of an output line ML when the logical operation circuit 1 is caused to perform a logical operation "ML=y1 NAND /y2";

FIG. 7B is a table showing the relation among first and second operation target data y1 and y2 and the value of the output line ML when the logical operation circuit 1 is caused to perform a logical operation "ML=y1 NOR /y2";

FIG. 18 is a table of the values of the lower and upper limits RL and RU of the area ratio Ra which satisfy the relation (4), using the ratio B and the ratio C1/C0 as parameters.

DESCRIPTION OF THE PREFERRED EMBODIMENT

Figure 1:
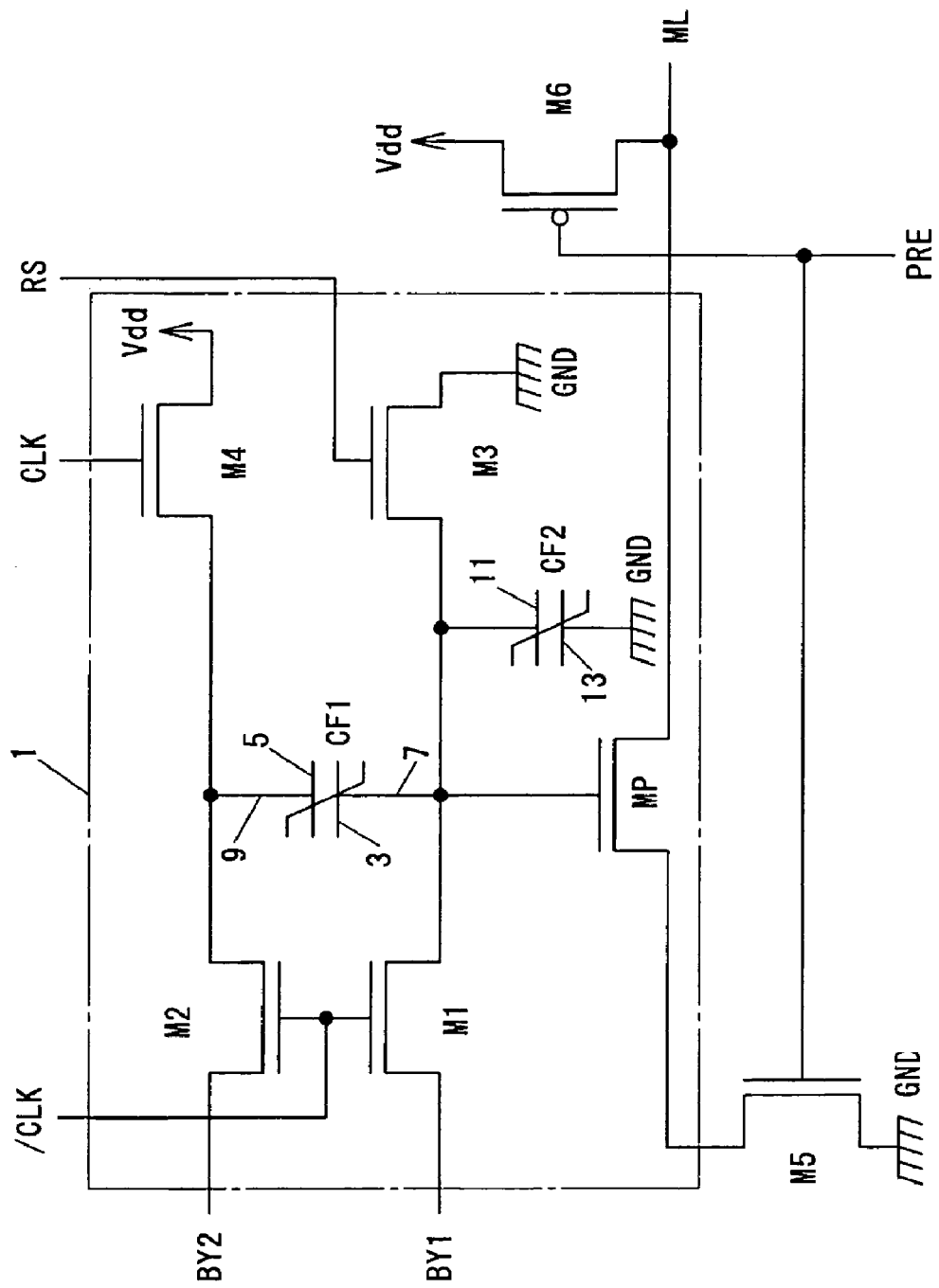
FIG. 1 is a circuit diagram illustrating a logical operation circuit 1 according to an embodiment of this invention.

FIG. 1 is a circuit diagram illustrating a logical operation circuit 1 according to an embodiment of this invention. The logical operation circuit 1 has a first ferroelectric capacitor CF1 as a non-volatile memory element, a second ferroelectric capacitor CF2 as a load element, a transistor MP as an output transistor, and transistors M1, M2, M3 and M4. The second ferroelectric capacitor CF2 and the transistor MP constitute an operation result output section. The transistors MP, M1, M2, M3 and M4 are N-channel MOSFETs (metal oxide semiconductor field effect transistors).

The ferroelectric capacitor CF1 has a first terminal 3 connected to a first signal line 7 and a second terminal 5 connected to a second signal line 9. The first signal line 7 is connected to a gate terminal as a control terminal of the transistor MP.

The ferroelectric capacitor CF2 has a third terminal 11 connected to the first signal line 7 and a fourth terminal 13 connected to a ground potential GND as a first reference potential.

The first signal line 7 is connected to a first bit line BY1 via the transistor M1 and to the ground potential GND via the transistor M3. The second signal line 9 is connected to a second bit line BY2 via the transistor M2 and to a source potential Vdd as a second reference potential via the transistor M4.

The transistors M1 and M2 have gate terminals connected to an inversion clock line /CLK. The transistors M3 and M4 have gate terminals connected to a reset line RS and a clock line CLK, respectively. The negation (inversion signal) of a binary number (binary signal) "A" is herein represented as "/A", unless otherwise stated.

The transistor MP has an input terminal connected to the ground potential GND via a transistor M5 and an output terminal connected to an output line ML. The output line ML is connected to the source potential Vdd via a transistor M6. The transistors MS and M6 have gate terminals connected to a preset line PRE. The transistor M5 is an N-channel MOSFET, and the transistor M6 is a P-channel MOSFET.

Figure 15:
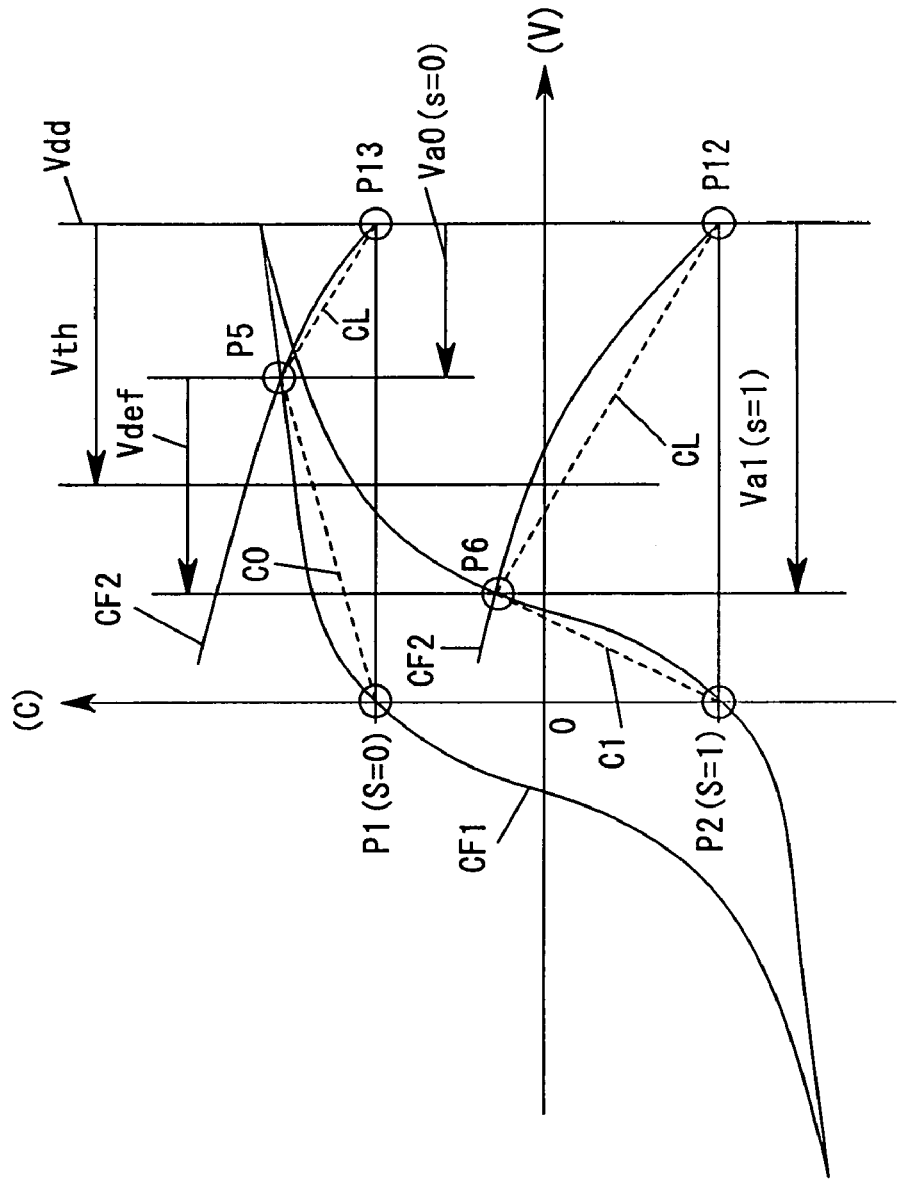
FIG. 15 is a graph used to explain the method for setting the capacitance ratio and area ratio between the ferroelectric capacitors CF1 and CF2 and the threshold voltage Vth of a transistor MP.

Description will be made of the setting of the capacitance ratio and area ratio between the ferroelectric capacitors CF1 and CF2 and the threshold voltage Vth of the transistor MP. FIG. 15 is a graph used to explain the method for setting the capacitance ratio and area ratio and the threshold voltage Vth, illustrating the polarization states of the ferroelectric capacitors CF1 and CF2 during a reading process, which will be described later.

As shown in FIG. 15, when the polarization state of the ferroelectric capacitor CF1 has become P2 before a reading process, it is shifted from P2 to P6 by the reading process. The average capacitance C1 of the ferroelectric capacitor CF1 at the time when its polarization state is shifted from P2 to P6 will be referred to as "ferroelectric capacitor CF1's average capacitance at the time of inversion".

At this time, the polarization state of the ferroelectric capacitor CF2 is shifted from P12 to P6. The average capacitance CL of the ferroelectric capacitor CF2 at the time when its polarization state is shifted from P12 to P6 will be referred to as "ferroelectric capacitor CF2's average capacitance at the time of non-inversion". The potential difference Va1 between P12 and P6 is the voltage which is generated at the gate terminal of the transistor MP by the reading process.

When the polarization state of the ferroelectric capacitor CF1 has become P1 before a reading process, it is shifted from P1 to P5 by the reading process. The average capacitance C0 of the ferroelectric capacitor CF1 at the time when its polarization state is shifted from P1 to P5 will be referred to as "ferroelectric capacitor CF1's average capacitance at the time of non-inversion".

At this time, the polarization state of the ferroelectric capacitor CF2 is shifted from P13 to P5. The average capacitance of the ferroelectric capacitor CF2 at the time when its polarization state is shifted from P13 to P5 is generally equal to the average capacitance CL of the ferroelectric capacitor CF2 at the time when its polarization state is shifted from P12 to P6. The potential difference Va0 between P13 and P5 is the voltage which is generated at the gate terminal of the transistor MP by the reading process.

Figure 16A:
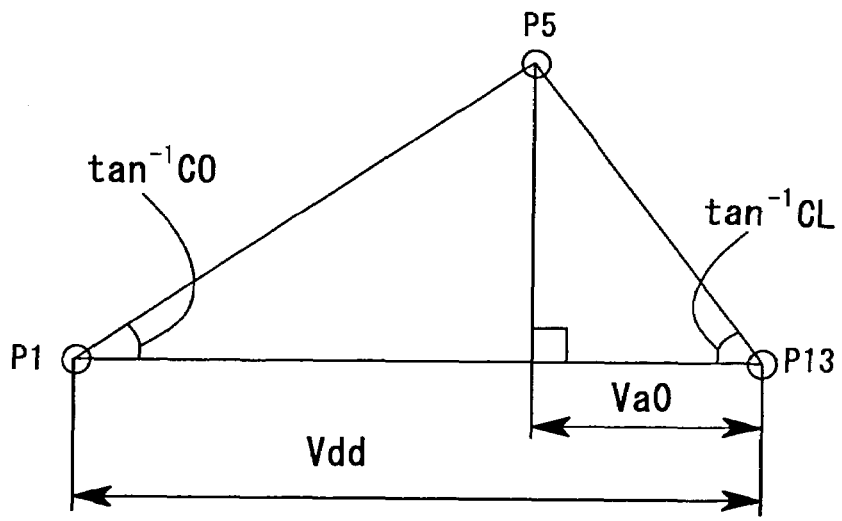
FIG. 16A and FIG. 16B are partial enlarged views of FIG. 17.
Figure 16B:
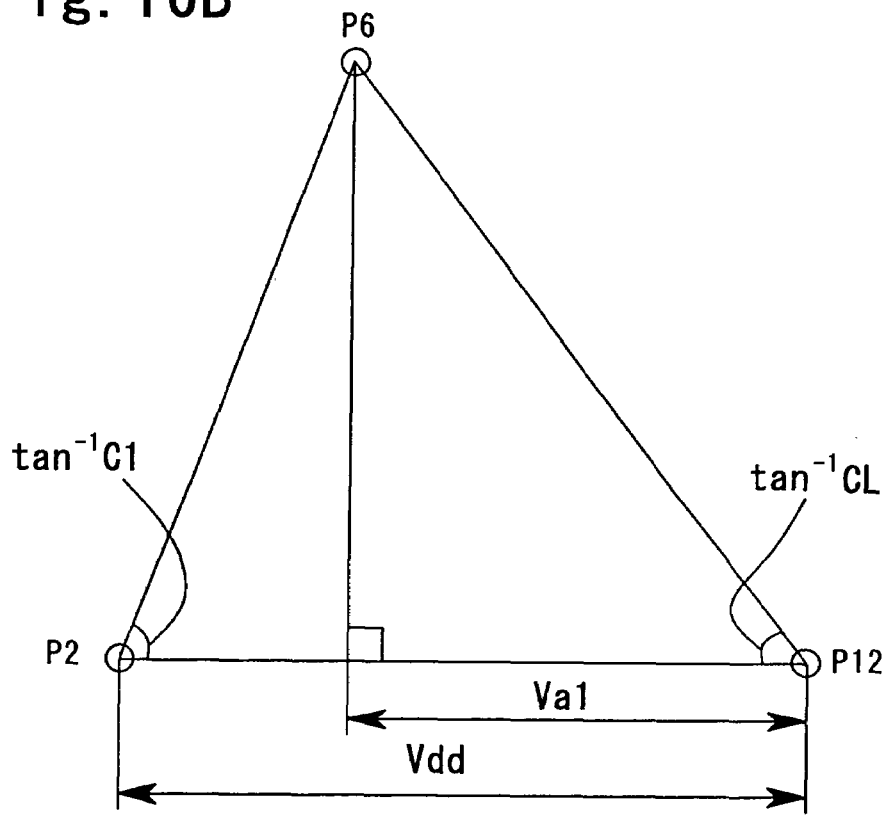

FIG. 16A and FIG. 16B are partial enlarged views of FIG. 15. As can be understood from FIG. 16A and FIG. 16B, the voltages Va0 and Va1 can be expressed by the following equations:

$$Va0 = C0/(C0+CL) \cdot Vdd$$

$$Va1 = C1/(C1+CL) \cdot Vdd$$

When the ratio of the ferroelectric capacitor CF2's average capacitance CL at the time of non-inversion to the ferroelectric capacitor CF1's average capacitance C0 at the time of non-inversion is represented as "capacitance ratio R", the potential difference Vdef between the voltages Va1 and Va0 shown in FIG. 15 can be expressed by the relation (1):

$$Vdef = (1/(1+C0/C1 \cdot R) - 1/(1+R)) \cdot Vdd \quad (1)$$

When the capacitance ratio R that maximizes the potential difference Vdef is assumed as R0, R0 is the solution of the following differential equation:

$$dVdef/dR = 0$$

When the equation is solved, the ratio R0 that maximizes the potential difference Vdef can be expressed by the following relation (2). In this specification and claims, "$\sqrt{(X)}$" represents the square root of X.

$$R0 = \sqrt{(C1/C0)} \quad (2)$$

Thus, when the maximum value of the potential difference Vdef is represented as "Vdef.max", Vdef.max is expressed by the following relation (3):

$$Vdef.max = (1/(1+\sqrt{(C0/C1)}) - 1/(1+\sqrt{(C1/C0)})) \cdot Vdd \quad (3)$$

Here, when the potential difference Vdef required in a reading process in the logical operation circuit 1 is at least B times the maximum value Vdef.max, the potential difference Vdef is expressed by the following relation:

$$Vdef \geq B \cdot Vdef.max$$

That is to obtain the potential difference Vdef required in a reading process in the logical operation circuit 1, the capacitance ratio R should satisfy the following relation (4):

$$1/(1+C0/C1 \cdot R) - 1/(1+R) \geq B \cdot (1/(1+\sqrt{(C0/C1)}) - 1/(1+\sqrt{(C1/C0)})) \quad (4)$$

The capacitance ratio R is the ratio of the ferroelectric capacitor CF2's average capacitance CL at the time of non-inversion to the ferroelectric capacitor CF1's average capacitance C0 at the time of non-inversion. However, when the ferroelectric capacitors CF1 and CF2 have ferroelectric layers of the same material and thickness since, for example, they were produced by the same process, the capacitance ratio R is generally equal to the ratio of the area (area ratio Ra) of the ferroelectric capacitor CF2 to that of the ferroelectric capacitor CF1.

In the logical operation circuit 1, the ferroelectric capacitors CF1 and CF2 have ferroelectric layers of the same material and thickness. When R=Ra in the relation (4), the relation (4) represents a condition that the area ratio Ra between the ferroelectric capacitors CF1 and CF2 of the logical operation circuit 1 must satisfy. Hereinafter, the above relations are regarded as describing the area ratio Ra, instead of the capacitance ratio R, between the ferroelectric capacitors CF1 and CF2, unless otherwise stated.

From the viewpoint of speeding up the logical operation, the higher the potential difference Vdef required in a reading process in the logical operation circuit 1, the better. Thus, the ratio B of the potential difference Vdef to the maximum value Vdef.max is preferably at least 0.75, more preferably at least 0.8, and more preferably at least 0.9. It is most preferable that B≈1.

In this embodiment, the ferroelectric capacitors CF1 and CF2 are constituted such that the area ratio Ra satisfies the relation (4) when B=0.75.

Figure 17:
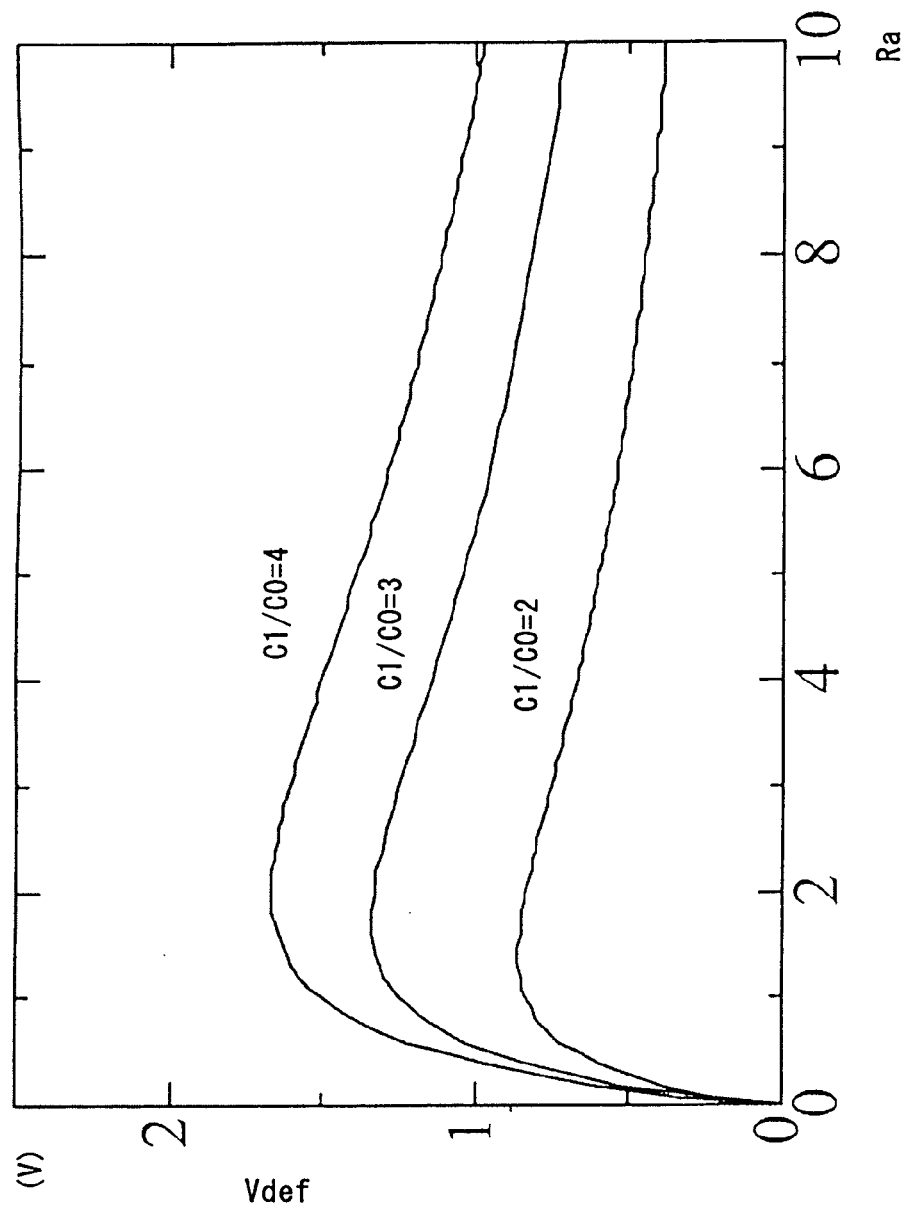
FIG. 17 is a graph illustrating the relation between the area ratio Ra and the potential difference Vdef, using the ratio C1/C0 as a parameter.

FIG. 17 is a graph of the equation (1), expressing the relation between the area ratio Ra between the ferroelectric capacitors CF1 and CF2 and the potential difference Vdef, using the ratio C1/C0 of the ferroelectric capacitor CF1's average capacitance C1 at the time of inversion to the ferroelectric capacitor CF1's average capacitance C0 at the time of non-inversion as a parameter. As can be understood from FIG. 17, the area ratio Ra that maximizes the potential difference Vdef is slightly different depending on the value of the ratio C1/C0. For example, when the ratio C1/C0 is about 4, the potential difference Vdef is maximum when the area ratio Ra is about 2. In this embodiment, Vdd=5 volts is assumed.

FIG. 18 is a table of the values of the lower and upper limits RL and RU of the area ratio Ra which satisfy the relation (4), using the ratio B of the potential difference Vdef to the maximum value Vdef.max and the ratio C1/C0 as parameters. For example, when the ratio B is 0.9 and the ratio C1/C0 is 4, the lower limit RL and upper limit RU of the area ratio Ra are 1.0 and 3.9, respectively. Thus, in this case, the area of the ferroelectric capacitor CF2 is set to 1.0 to 3.9 times that of the ferroelectric capacitor CF1.

It is most preferable that the potential difference Vdef is generally equal to the maximum value Vdef.max. For example, when the ratio C1/C0 is 4, 3, and 2, the area ratios Ra at which the potential difference Vdef is generally equal to the maximum value Vdef.max are about 2, about 1.7, and about 1.4, respectively, according to the relation (2).

As described above, the area ratio Ra between the ferroelectric capacitors CF1 and CF2 is determined.

As shown in FIG. 15, the threshold voltage Vth of the transistor MP is set to about ½·(Va0+Va1). The ON/OFF operation margin of the transistor MP can be thereby maximized to about ±½·Vdef.

When the area ratio Ra between the ferroelectric capacitors CF1 and CF2 is set such that the potential difference Vdef is as large as possible as described before, and when the threshold voltage Vth of the transistor MP is set to about ½·(Va0+Va1) as described above, the ON/OFF operation margin of the transistor MP can be significantly large.

As a result, a reading process can be performed at a high speed without using an amplifying circuit such as a sense amplifier. That is, the logical operation circuit 1 is suitable for a logical operation which requires high-speed operation. Also, the logical operation circuit 1 can be highly integrated with ease since no sense amplifier is used. Thus, it is possible to realize a compact logical operation circuit which can perform a complex logical operation with ease.

Figure 2:
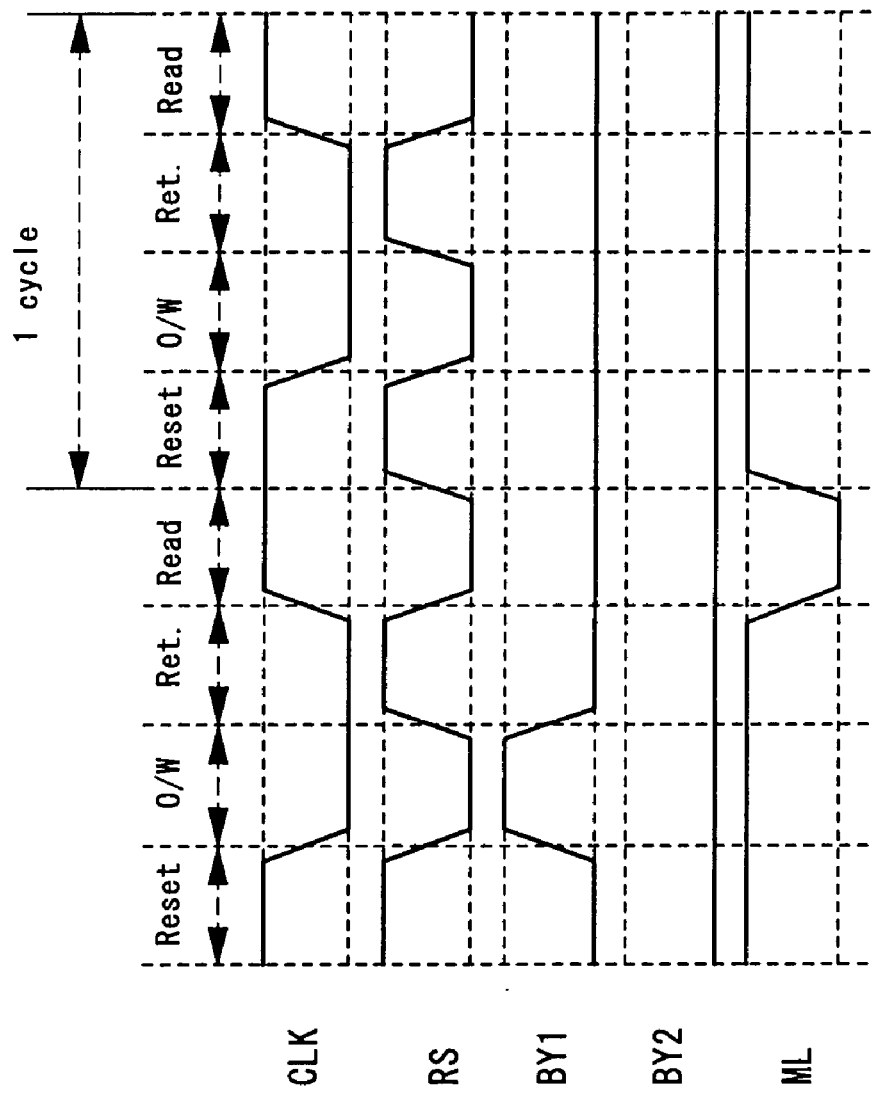
FIG. 2 is a timing diagram illustrating the operation of the logical operation circuit 1.

Description will be made of the operation of the logical operation circuit 1 shown in FIG. 1. FIG. 2 is a timing diagram illustrating the operation of the logical operation circuit 1.

In a reset process, an "H" potential (namely, the source potential Vdd) is given to both the clock line CLK and the reset line RS. An "L" potential (namely, the ground potential GND) is given to both the bit lines BY1 and BY2.

Figure 3A:
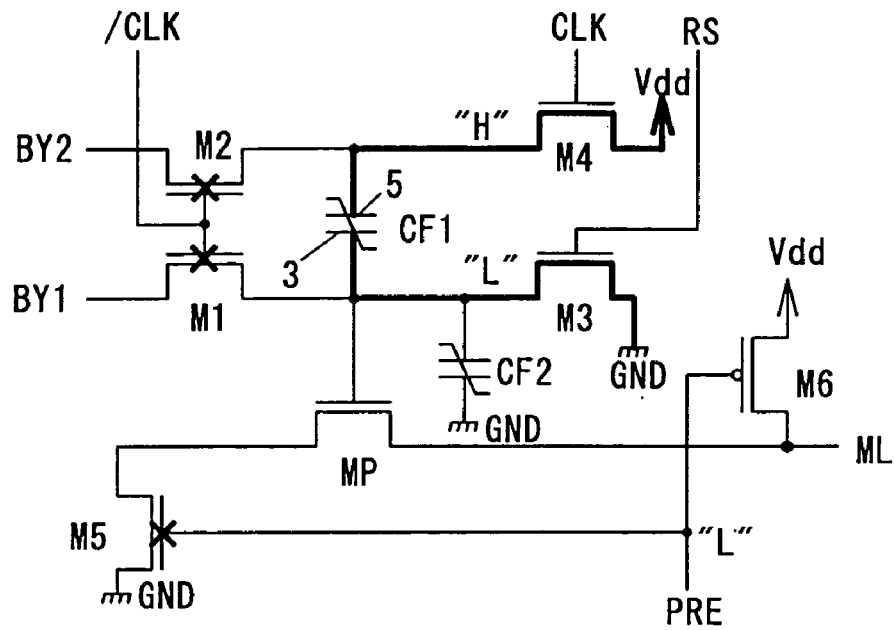
FIG. 3A is a view illustrating the state of the logical operation circuit 1 during a reset process.
Figure 3B:
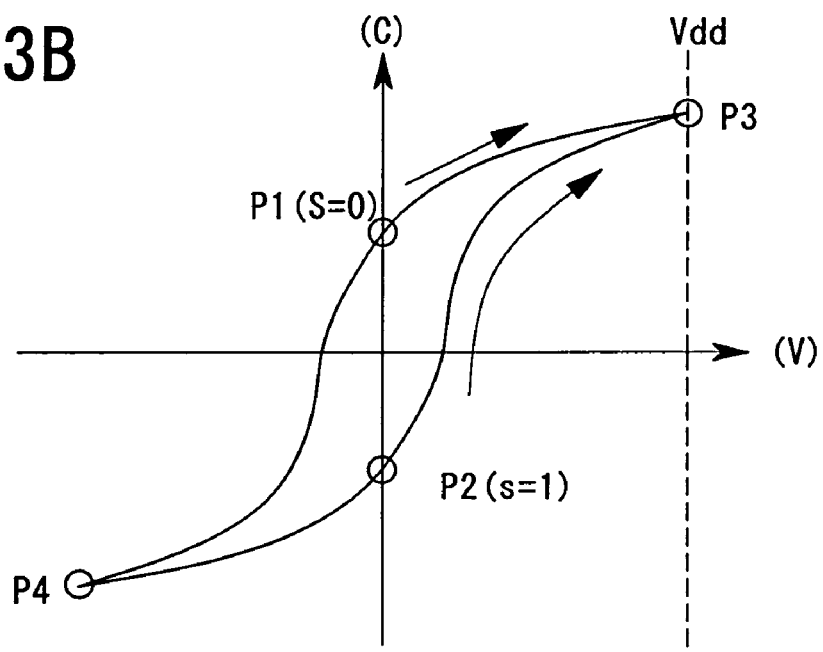
FIG. 3B is a graph illustrating the polarization state of a ferroelectric capacitor CF1 during the reset process.

FIG. 3A is a view illustrating the state of the logical operation circuit 1 during the reset process, and FIG. 3B is a graph illustrating the polarization state of the ferroelectric capacitor CF1 during the reset process. As shown in FIG. 3A, the transistors M1 and M2 are both off and the transistors M3 and M4 are both on. Thus, "L" and "H" are applied to the first terminal 3 and the second terminal 5, respectively, of the ferroelectric capacitor CF1.

At this time, the polarization state of the ferroelectric capacitor CF1 is shifted from P1 or P2 to P3 as shown in FIG. 3B. When the application of voltages to the first terminal 3 and the second terminal 5 is stopped, the polarization state of the ferroelectric capacitor CF1 is shifted from P3 to a residual polarization state P1. The residual polarization state P1 corresponds to a logical operator NAND (negative AND) as described later. As described above, a logical operator of the logical operation circuit 1 can be set by a reset process.

Although one of input/output terminals of the transistor M3 is connected to the ground potential GND and one of input/output terminals of the transistor M4 is connected to the source potential Vdd in FIG. 3A, this invention is not limited thereto.

For example, in contrast to the case shown in FIG. 3A, one of the input/output terminals of the transistor M3 may be connected to the source potential Vdd and one of the input/output terminals of the transistor M4 may be connected to the ground potential GND. In this case, the polarization state of the ferroelectric capacitor CF1 is shifted to P4 by the reset process in contrast to the case shown in FIG. 3A. Then, when application of voltages to the first terminal 3 and the second terminal 5 is stopped, the polarization state of the ferroelectric capacitor CF1 is shifted from P4 to a residual polarization state P2. The residual polarization state P2 corresponds to a logical operator NOR (negative OR) as described later.

Either of the ground potential GND or the source potential Vdd may be applied to one of the input/output terminals of the transistor M3 and the other may be applied to one of the input/output terminals of the transistor M4. A desired logical operator can be thereby selected by the reset process.

The residual polarization states P1 and P2 may be referred to as "first residual polarization state" (s=0) and "second residual polarization state" (s=1), respectively.

In this process, since an "L" is given to the preset line PRE as shown in FIG. 3A, the transistors M5 and M6 are off and on, respectively. Thus, the output line ML has an "H".

As shown in FIG. 2, the reset process is followed by an operation and storage process (O/W). In an operation and storage process, an "L" potential is given to both the clock line CLK and the reset line RS. First and second operation target data y1 and y2 are given to the bit lines BY1 and BY2, respectively.

In this embodiment, an "H" is given to the bit line BY1 when y1=1 and an "L" is given to the bit line BY1 when y1=0. The relation between y2 and the bit line BY2 is the same as that between y1 and the bit line BY1. Thus, in the operation and storage process shown in FIG. 2, y1=1 and y2=0 are given as the first and second operation target data, respectively.

Figure 4A:
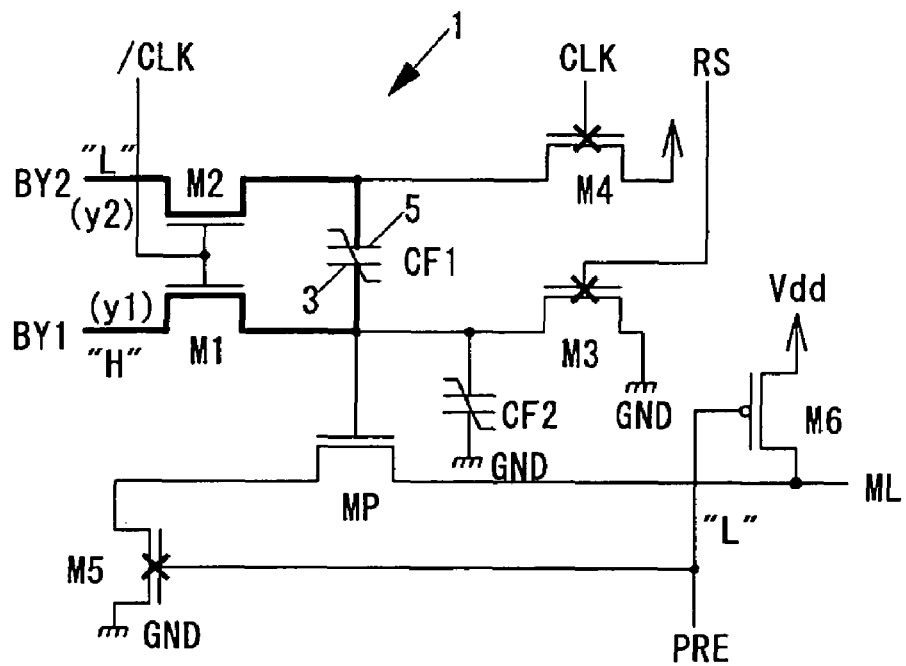
FIG. 4A is a view illustrating the state of the logical operation circuit 1 during an operation and storage process.
Figure 4B:
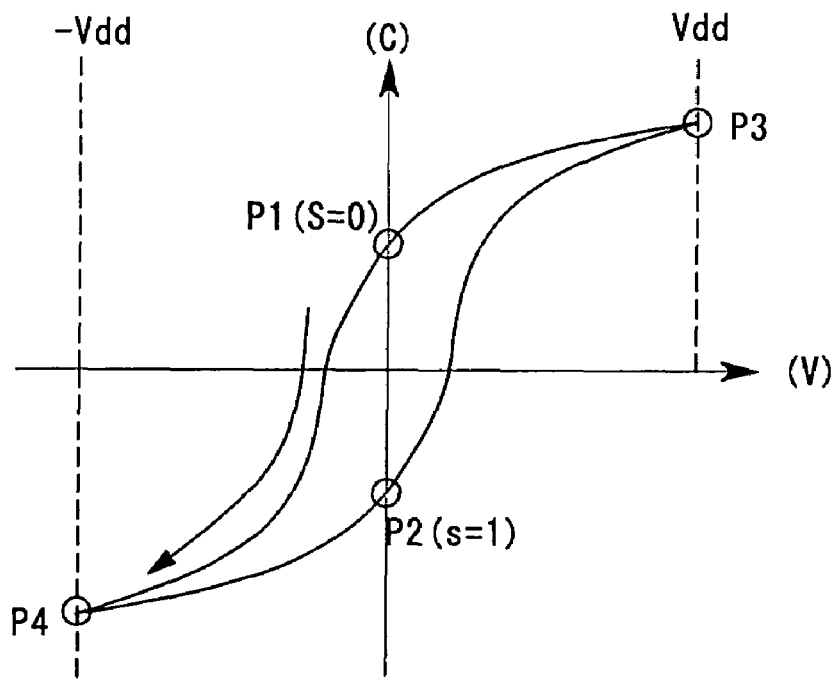
FIG. 4B is a graph illustrating the polarization state of the ferroelectric capacitor CF1 during the operation and storage process.

FIG. 4A is a view illustrating the state of the logical operation circuit 1 during the operation and storage process, and FIG. 4B is a graph illustrating the polarization state of the ferroelectric capacitor CF1 during the operation and storage process. As shown in FIG. 4A, the transistors M1 and M2 are both on and the transistors M3 and M4 are both off. Thus, "H" and "L" are applied to the first terminal 3 and the second terminal 5, respectively, of the ferroelectric capacitor CF1.

At this time, the polarization state of the ferroelectric capacitor CF1 is shifted from P1 to P4 as shown in FIG. 4B. When y1=0 and y2=1 are given as the first and second operation target data, respectively, the polarization state of the ferroelectric capacitor CF1 is shifted from P1 to P3. When y1=0 and y2=0 are given or when y1=1 and y2=1 are given, the polarization state of the ferroelectric capacitor CF1 is maintained at P1.

In the operation and storage process, a logical operation is performed on the first and second operation target data y1 and y2 according to the logical operator set by the reset process and a polarization state corresponding to the result of the logical operation is generated in the ferroelectric capacitor CF1.

Also in this process, since an "L" is given to the preset line PRE as shown in FIG. 4A, the transistors M5 and M6 are off and on, respectively. Thus, the output line ML has an "H".

As shown in FIG. 2, the operation and storage process is followed by a retention process (Ret.). In a retention process, "L" and "H" are given to the clock line CLK and the reset line RS, respectively, and an "L" is given to both the bit lines BY1 and BY2.

Figure 5A:
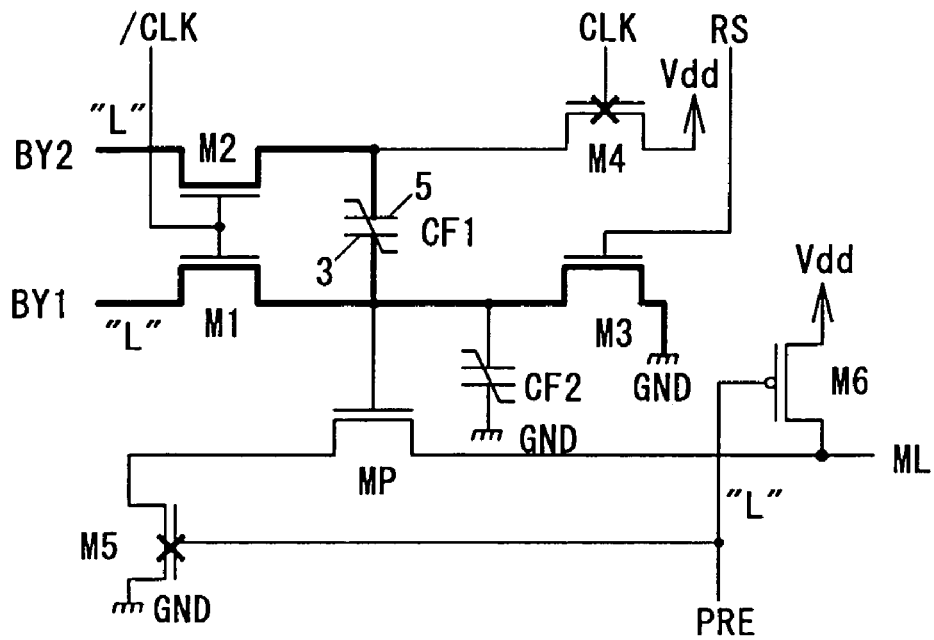
FIG. 5A is a view illustrating the state of the logical operation circuit 1 during a retention process.
Figure 5B:
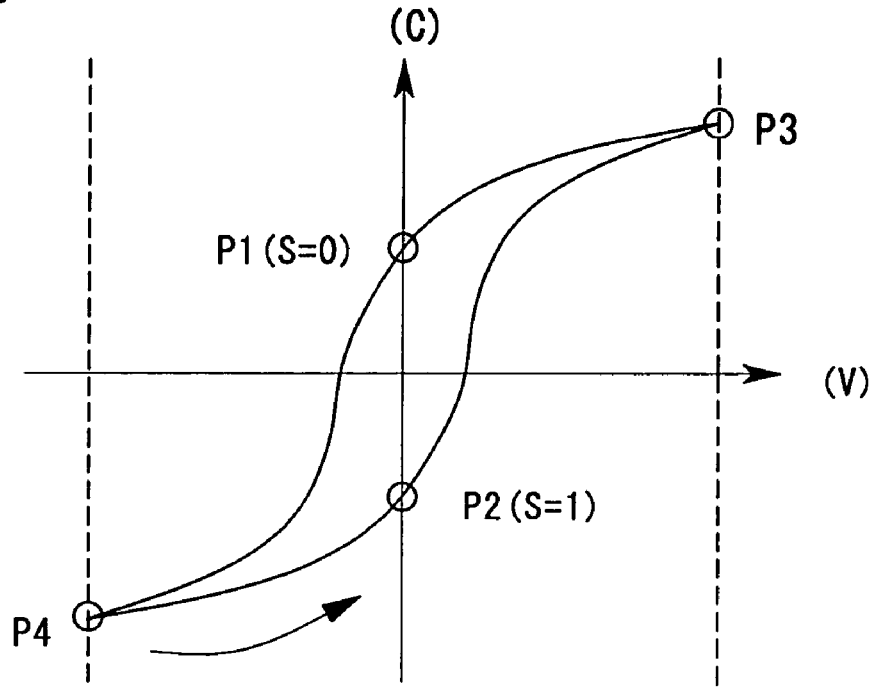
FIG. 5B is a graph illustrating the polarization state of the ferroelectric capacitor CF1 during the retention process.

FIG. 5A is a view illustrating the state of the logical operation circuit 1 during the retention process, and FIG. 5B is a graph illustrating the polarization state of the ferroelectric capacitor CF1 during the retention process. As shown in FIG. 5A, the transistors M1, M2 and M3 are all on and the transistor M4 is off. Thus, an "L" is applied to both the first terminal 3 and the second terminal 5 of the ferroelectric capacitor CF1.

At this time, the polarization state of the ferroelectric capacitor CF1 is shifted from P4 to P2 as shown in FIG. 5B. When the polarization state of the ferroelectric capacitor CF1 has become P3 by the operation and storage process, it is shifted from P3 to P1. When the polarization state of the ferroelectric capacitor CF1 has become P1 by the operation and storage process, it is maintained as it is.

Also in this process, since an "L" is given to the preset line PRE as shown in FIG. 5A, the transistors M5 and M6 are off and on, respectively. Thus, the output line ML has an "H".

As shown in FIG. 2, the retention process is followed by a reading process (Read). In a reading process, "H" and "L" are given to the clock line CLK and the reset line RS, respectively, and an "L" is given to both the bit lines BY1 and BY2.

Figure 6A:
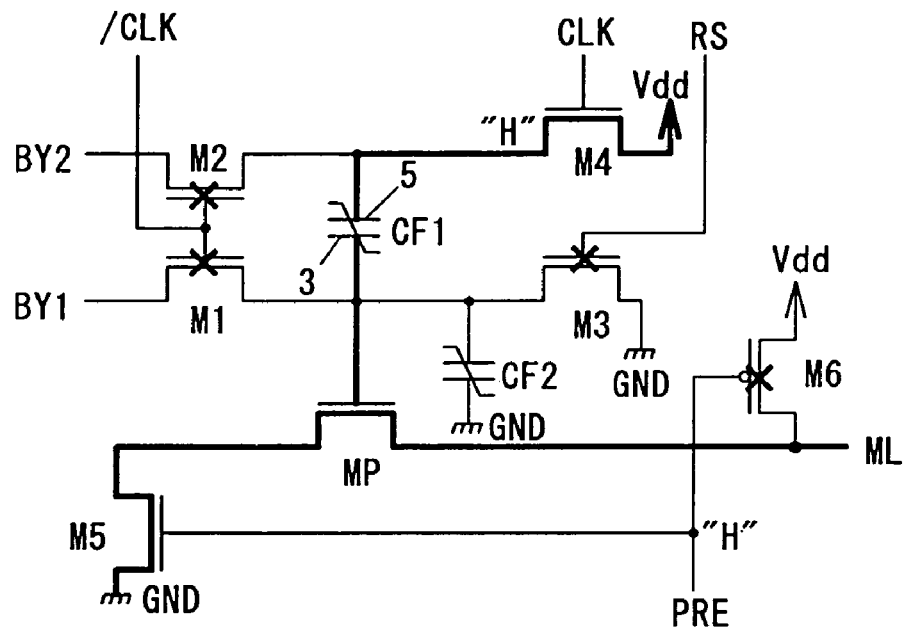
FIG. 6A is a view illustrating the state of the logical operation circuit 1 during a reading process.
Figure 6B:
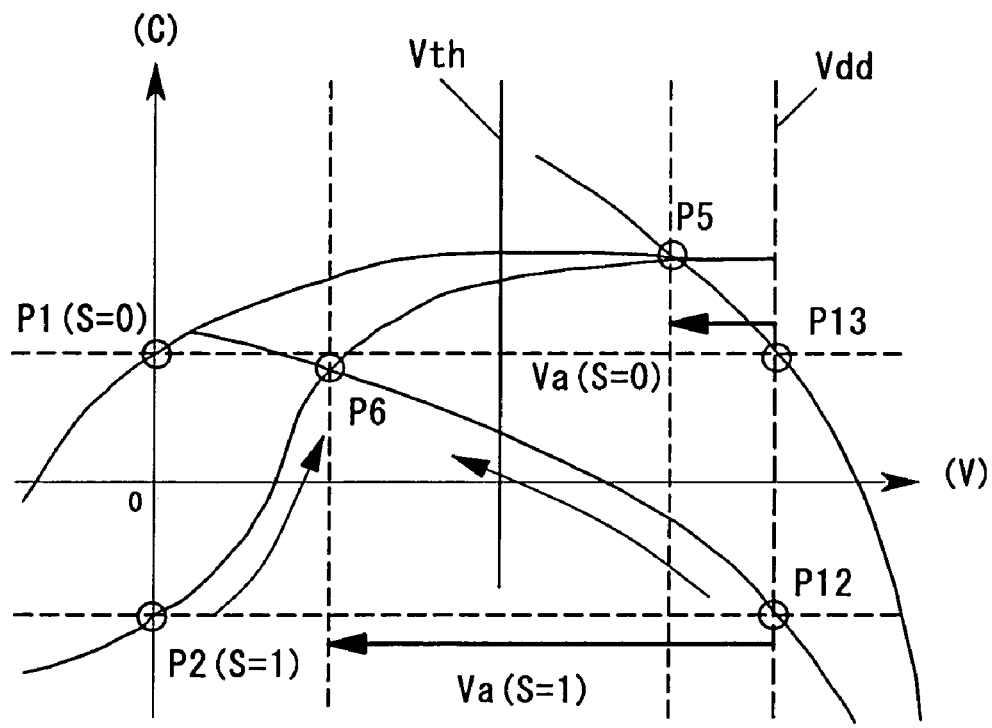
FIG. 6B is a graph illustrating the polarization state of the ferroelectric capacitor CF1 during the reading process.

FIG. 6A is a view illustrating the state of the logical operation circuit 1 during the reading process, and FIG. 6B is a graph illustrating the polarization state of the ferroelectric capacitor CF1 during the reading process. As shown in FIG. 6A, the transistors M1, M2 and M3 are all off and the transistor M4 is on. Thus, an "H" is applied to the second terminal 5 of the ferroelectric capacitor CF1.

According to a graphical analysis, when the polarization state of the ferroelectric capacitor CF1 has become P2 by the above retention process, that is, when y1=1 and y2=0 have been given as the first and second operation target data, respectively, the polarization state of the ferroelectric capacitor CF1 is shifted from P2 to P6 by the reading process as shown in FIG. 6B.

At this time, the polarization state of the ferroelectric capacitor CF2 is shifted from P12 to P6. That is, the potential Va at the gate terminal of the transistor MP is shifted from the potential of P12 (ground potential GND) to the potential of P6.

When the polarization state of the ferroelectric capacitor CF1 has become P1 by the above retention process, that is, when y1=0 and y2=0 have been given as the first and second operation target data, respectively, when y1=1 and y2=1 have been given as the first and second operation target data, respectively, or when y1=0 and y2=1 have been given as the first and second operation target data, respectively, the polarization state of the ferroelectric capacitor CF1 is shifted from P1 to P5. At this time, the polarization state of the ferroelectric capacitor CF2 is shifted from P13 to P5. That is, the potential Va at the gate terminal of the transistor MP is shifted from the potential of P13 (ground potential GND) to the potential of P5.

The difference between the threshold voltage Vth of the transistor MP and the ground potential GND is set to have an absolute value Vath (which is equal to Vth in this embodiment) which is smaller than the potential difference between P12 and P6 (namely, Va1) and greater than the potential difference between P13 and P5 (namely, Va0).

Thus, when the polarization state of the ferroelectric capacitor CF1 has become P2 by the retention process (that is, when s=1), the transistor MP becomes on, and when the polarization state of the ferroelectric capacitor CF1 has become P1 by the retention process (that is, when s=0), the transistor MP becomes off.

Also, since the area ratio Ra between the ferroelectric capacitors CF1 and CF2 are set such that the potential difference Vdef is as large as possible, and since the threshold voltage Vth of the transistor MP is set to about ½·(Va0+Va1) as described previously, the ON/OFF operation margin of the transistor MP is significantly large.

Since an "H" is given to the preset line PRE in the reading process as shown in FIG. 6A, the transistor M5 and M6 are on and off, respectively. Thus, the value of the output line ML differs depending on whether the transistor MP is on or off.

That is to say, the value of the output line ML becomes "L" or "H" depending on whether the transistor MP is on or off (see FIG. 6A). When the values "L" and "H" of the output line ML are associated with logics "0" and "1", respectively, the relation among the first and second operation target data y1 and y2 and the value of the output line ML (the result of the logical operation) is as shown in FIG. 7A.

As can be understood from FIG. 7A, the logical operation circuit 1 performs a logical operation "ML=y1 NAND /y2 (negative AND of y1 and /y2)".

As shown in FIG. 2, by repeating a cycle configured with the reset process to the reading process, a logical operation can be performed on first and second operation target data of various types.

In this embodiment, the logical operator is set to NAND (negative AND) by setting the polarization state of the ferroelectric capacitor CF1 to be P1 (that is, S=0) by the reset process. However, the logical operator can be set to NOR (negative OR) by setting the polarization state of the ferroelectric capacitor CF1 to be P2 (that is, S=1) by the reset process.

FIG. 7B is a table showing the relation among the first and second operation target data y1 and y2 and the value of the output line ML (the result of the logical operation) when the logical operator is set to NOR. It can be understood from FIG. 7B that the logical operation circuit performs a logical operation "ML=y1 NOR /y2 (negative OR of y1 and /y2)" in this case.

Figure 8A:
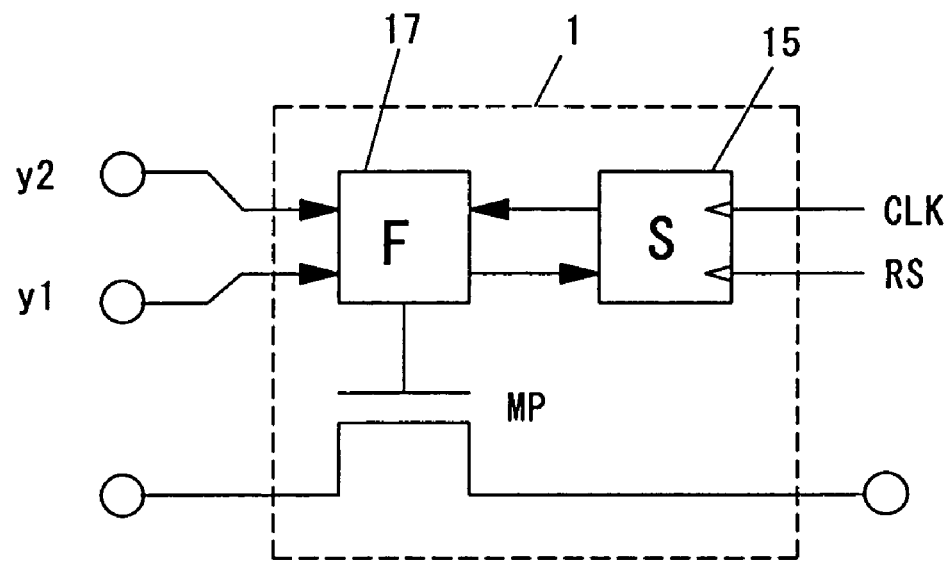
FIG. 8A is a block diagram illustrating the logical operation circuit 1.

FIG. 8A is a block diagram of the logical operation circuit 1 shown in FIG. 1. In FIG. 8A, the ferroelectric capacitor CF1 is represented as a memory function block 15, and the ferroelectric capacitors CF1 and CF2 and the transistor MP are represented as a logical operation function block 17.

That is, the logical operation circuit 1 shown in FIG. 1 can be regarded as a circuit having a memory function block 15 for storing a specified logical operator, a logical operation function block 17 for performing a logical operation on first and second operation target data y1 and y2 according to the logical operator, and a transistor MP which is turned on or off according to the result of the logical operation.

Figure 8B:
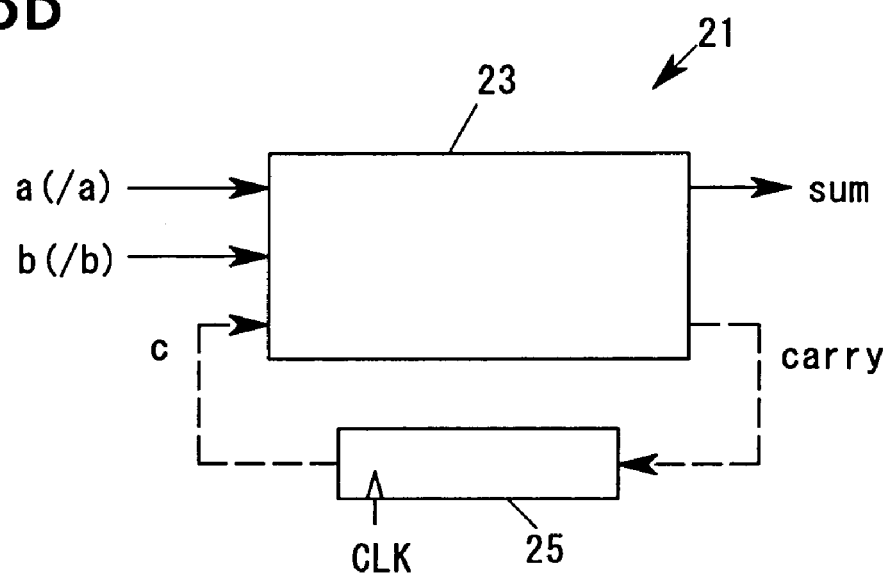
FIG. 8B is a block diagram illustrating a serial adder 21 using the logical operation circuit 1.

FIG. 8B is a block diagram illustrating a serial adder 21 using the logical operation circuit 1 shown in FIG. 1. The serial adder 21 has a full adder 23 and a register function section 25. The full adder 23 receives two 1-bit binary numbers "a" and "b" and a carry "c" from a lower bit and performs an addition to produce the sum and the carry of the binary numbers "a" and "b" and the carry "c" from a lower bit. The register function section 25 inputs the carry as a carry "c" at addition of the next digit under the control of the clock line CLK.

To add two multi-bit numbers A and B using the serial adder 21, the above addition process is performed on the least significant bit to the most significant bit.

Figure 9:
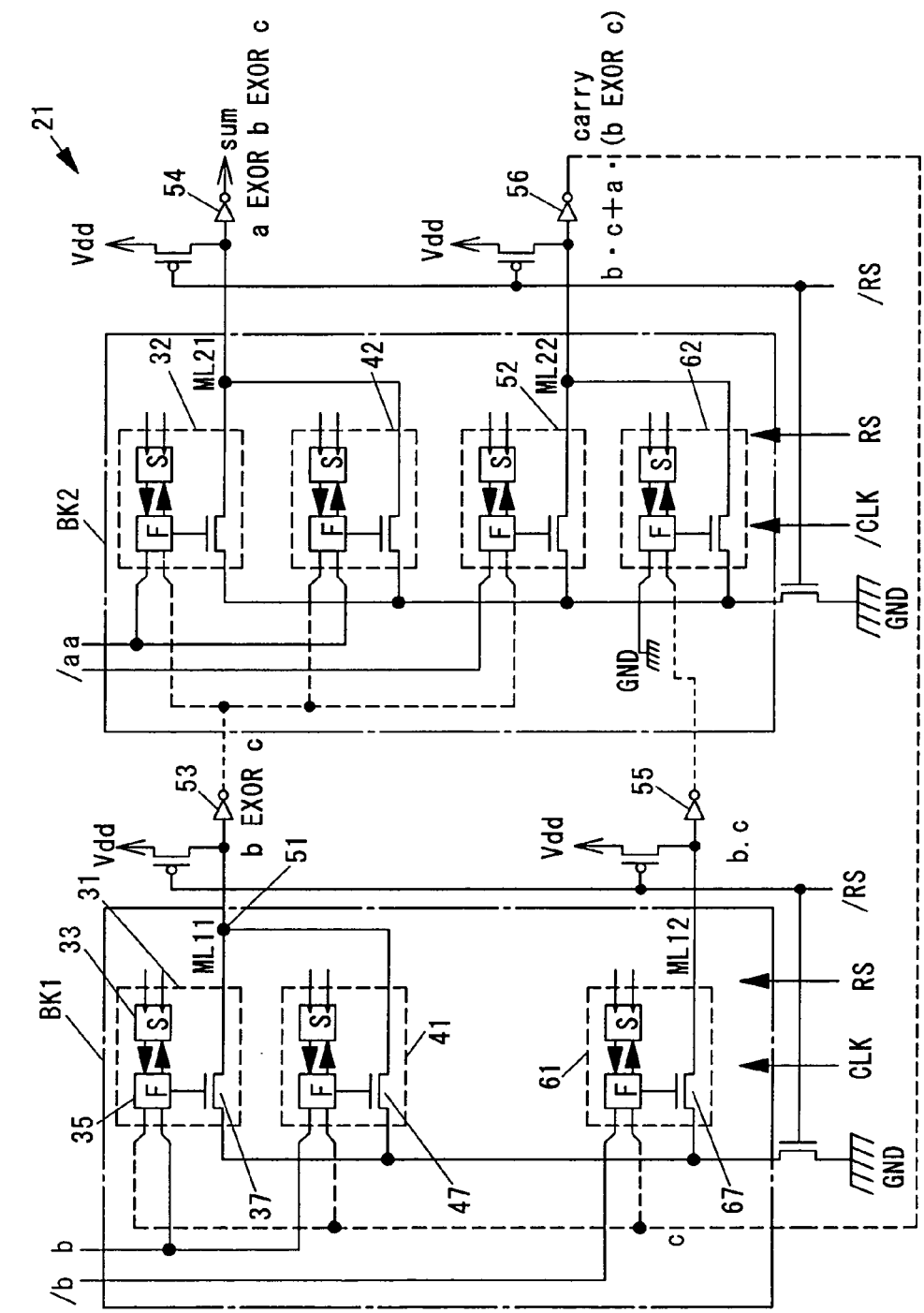
FIG. 9 is a circuit diagram of the serial adder 21 shown in FIG. 8B realized using the logical operation circuits 1.

FIG. 9 is a circuit diagram of the serial adder 21 shown in FIG. 8B, which is realized using the logical operation circuits 1. As shown in FIG. 9, the serial adder 21 has a first block BK1 and a second block BK2.

The first block BK1 has three logical operation circuits 31, 41 and 61 each having the same constitution as the logical operation circuit 1 shown in FIG. 1. The logical operation circuits 31, 41 and 61 have a clock line CLK, an inversion clock line /CLK and a reset line RS which are similar to those of the logical operation circuit 1 shown in FIG. 1, and control signals which are similar to those in the logical operation circuit 1 are given to the control signal lines. The logical operation circuits 31, 41 and 61 have an inversion reset line /RS as a control signal line corresponding to the preset line PRE of the logical operation circuit 1. An inversion signal of the reset line RS is given to the inversion reset line /RS.

The second block BK2 has four logical operation circuits 32, 42, 52 and 62, each having the same constitution as the logical operation circuit 1 shown in FIG. 1. In the logical operation circuits 32, 42, 52 and 62, the control signal lines are connected in the same manner as those in the logical operation circuits 31, 41 and 61 constituting the first block BK1 except that the connection of the clock line CLK and the inversion clock line /CLK is reversed from that in the first block BK1.

Figure 10:
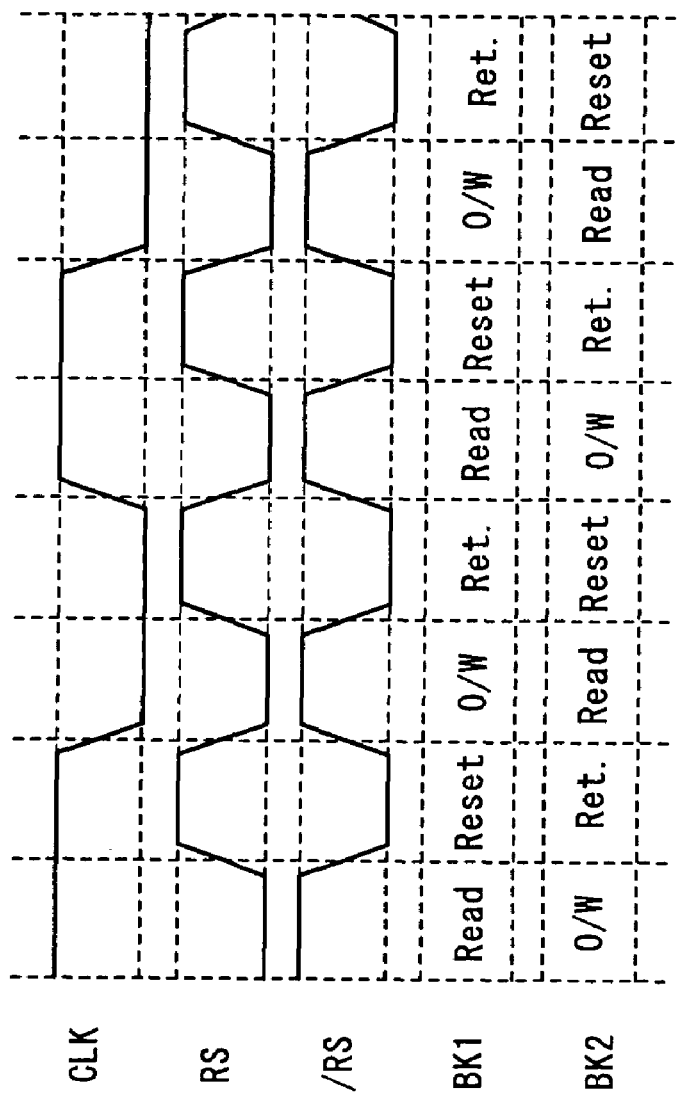
FIG. 10 is a timing diagram illustrating control signals which are given to logical operation circuits constituting a first block BK1 and logical operation circuits constituting a second block BK2.

FIG. 10 is a timing diagram illustrating control signals which are given to the logical operation circuits 31, 41 and 61 constituting the first block BK1 and the logical operation circuits 32, 42, 52 and 62 constituting the second block BK2. It can be understood that in the logical operation circuits constituting the first block BK1 and the logical operation circuits constituting the second block BK2, one set of processes is performed during one period of the control signal given to the clock line CLK, and the processes of those circuits are shifted from each other by a half period of the control signal.

As shown in FIG. 9, the logical operation circuit 31 of the first block BK1 has a memory function block 33 in which a logical operator has been stored as in the case with the logical operation circuit 1 (see FIG. 8A) and a logical operation function block 35 for performing an operation on "b" and a carry "c" from a lower bit as first and second operation target data according to the logical operator.

The on and off of a transistor 37 is controlled according to the result of the operation. Thus, the transistor 37 outputs "b NAND /c". When the logical operators AND and OR are represented as "." and "+", respectively, the output from the transistor 37 is represented as "/(b·/c)".

Similarly, the logical operation circuit 41 has a transistor 47 which outputs "/(c·/b)".

A wired OR 51 calculates the negative logic OR (namely positive logic AND) of the output from the transistor 37 of the logical operation circuit 31 and the output from the transistor 47 of the logical operation circuit 41. Thus, the value of the output line ML11 of the wired OR51 becomes "/((b·/c)+(c·/b))". An inverter 53 shown in FIG. 9 therefore outputs "(b·/c)+(c·/b))", namely "b EXOR c" (the exclusive OR of "b" and "c").

The value of the output line ML12 connected to the output terminal of a transistor 67 of the logical operation circuit 61 becomes "/(b·c)". Thus, an inverter 55 shown in FIG. 9 outputs (b·c).

Similarly, in the second block BK2, the sum, which is the output from an inverter 54, namely the output from the serial adder 21, is "a EXOR b EXOR c". The output from an inverter 56, namely the carry from the serial adder 21 is "b·c+a·(b EXOR c)".

As described above, the serial adder 21 can be constituted with ease by using the logical operation circuits 1 shown in FIG. 1.

Figure 11:
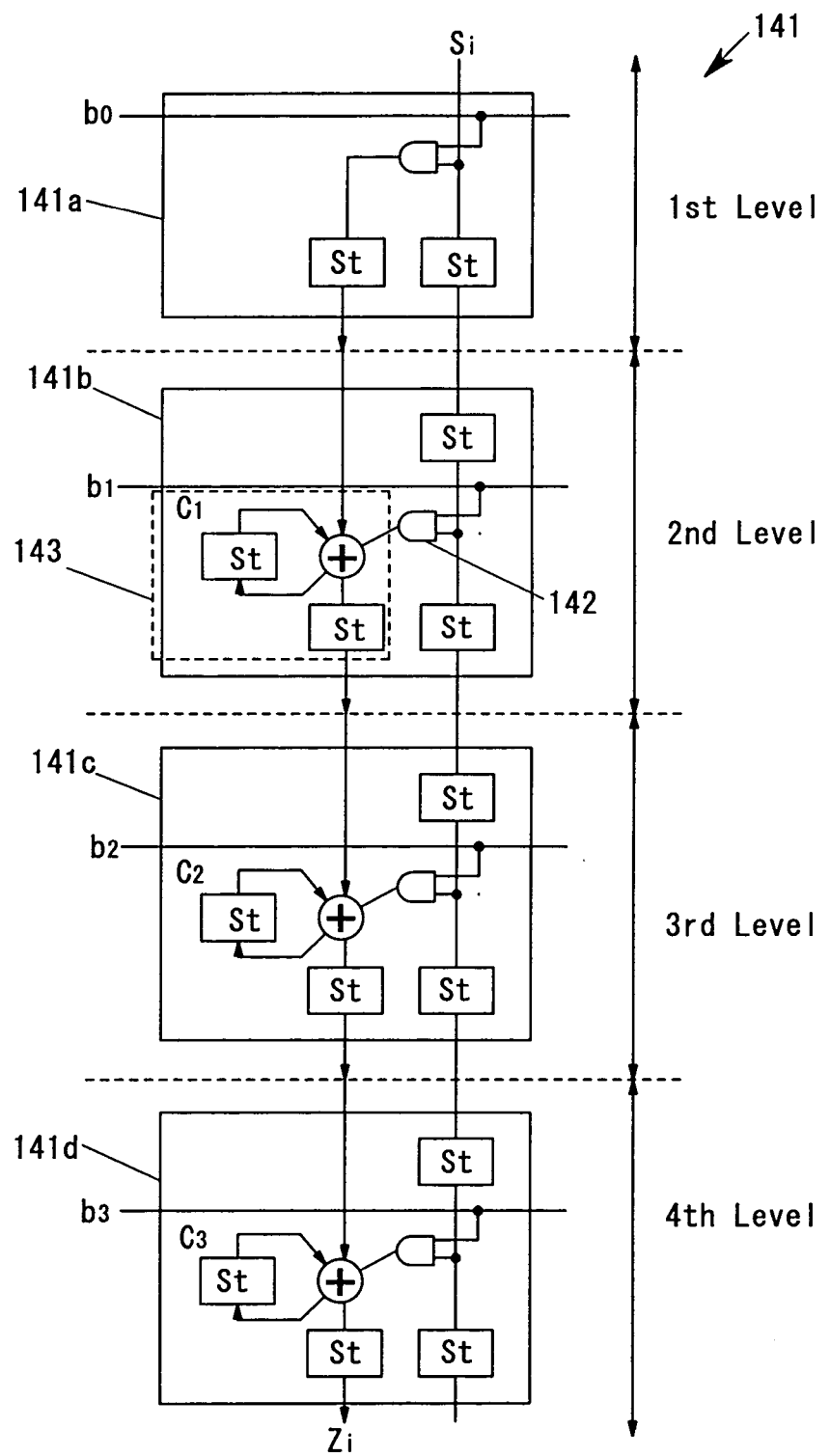
FIG. 11 is block diagram illustrating an example of the constitution of a series-parallel pipeline multiplier using the logical operation circuits 1 shown in FIG. 1.

FIG. 11 is block diagram illustrating an example of the constitution of a series-parallel pipeline multiplier using the logical operation circuits 1 shown in FIG. 1. A pipeline multiplier 141 is configured to divide the multiplication of a 4-bit multiplicand "s" and a 4-bit multiplier "b" into the same number of levels as the number of bits of the multiplier "b", namely four levels, and performs the operation in sequence. As shown in FIG. 11, first to fourth level operation sections 141a to 141d perform first to fourth level operations, respectively.

For example, the second level operation section 141b has an AND circuit 142, as an element partial product generation section and a serial pipeline full adder 143 as an element operation device. In the drawing, each "st" with a square around it is a symbol representing a storage section and each "+" with a circle around it is a symbol representing a full adder. The third and fourth level operation sections 141c and 141d have the same constitution. The first level operation section 141a does not have a full adder.

Figure 12:
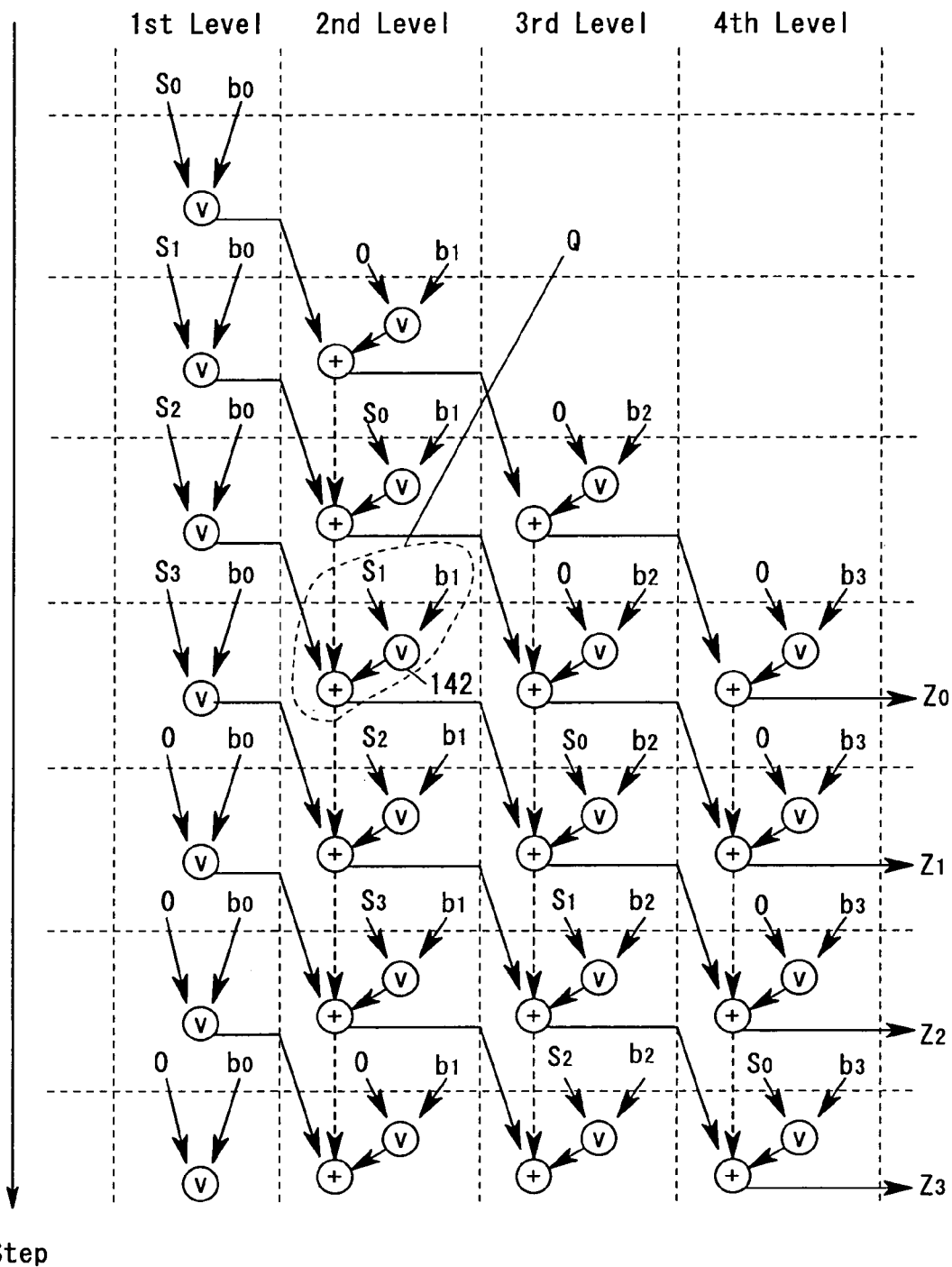
FIG. 12 is a view used to explain the operation of a pipeline multiplier 141.

FIG. 12 is a view used to explain the operation of the pipeline multiplier 141. In the drawing, the operations of the first to fourth levels are shown from left to light. In the operation of each level, steps (time) proceed from top to bottom. In the drawing, each "V" with a circle around it is a symbol representing the AND circuit 142. Also in the drawing, each broken line with a downward-pointing arrow connecting adjacent symbols representing full adders within the same level in the second to fourth levels represents a flow of a carry.

For example, the operation of the second level operation section 141b of the pipeline multiplier 141, namely the second level operation, is shown in the second column from the left in FIG. 12. Thus, the operation in the third step (third cycle) of the second level operation section 141b, for example, is shown in the third row from the top in the second column from the left, that is in the area "Q" in the drawing.

The operation in the third step of the second level operation section 141b of the pipeline multiplier 141 will be described.

First, the AND circuit 142, calculates the AND of an operation target multiplicand bit s1 as an object of the operation of the second level of the four bits constituting the multiplicand "s" and a bit b1 corresponding to the second level of the four bits constituting the multiplier "b". Then, the pipeline full adder 143 calculates the sum of three binary numbers: the AND calculated as above, the partial product produced in the previous level, namely the first level, and the carry of a bit s0, which is the bit before the operation target multiplicand bit s1, in the second level.

The result of the calculation in the pipeline full adder 143 is sent as a partial product of the operation target multiplicand bit s1 in the second level to the third level as the next level. The carry generated by the addition is stored as a carry of the operation target multiplicand bit s1 in the second level.

The third and fourth level operation sections 141c and 141d perform operations in the same manner. The first level operation section 141a calculates an AND as an element partial product but does not perform an addition.

Figure 13:
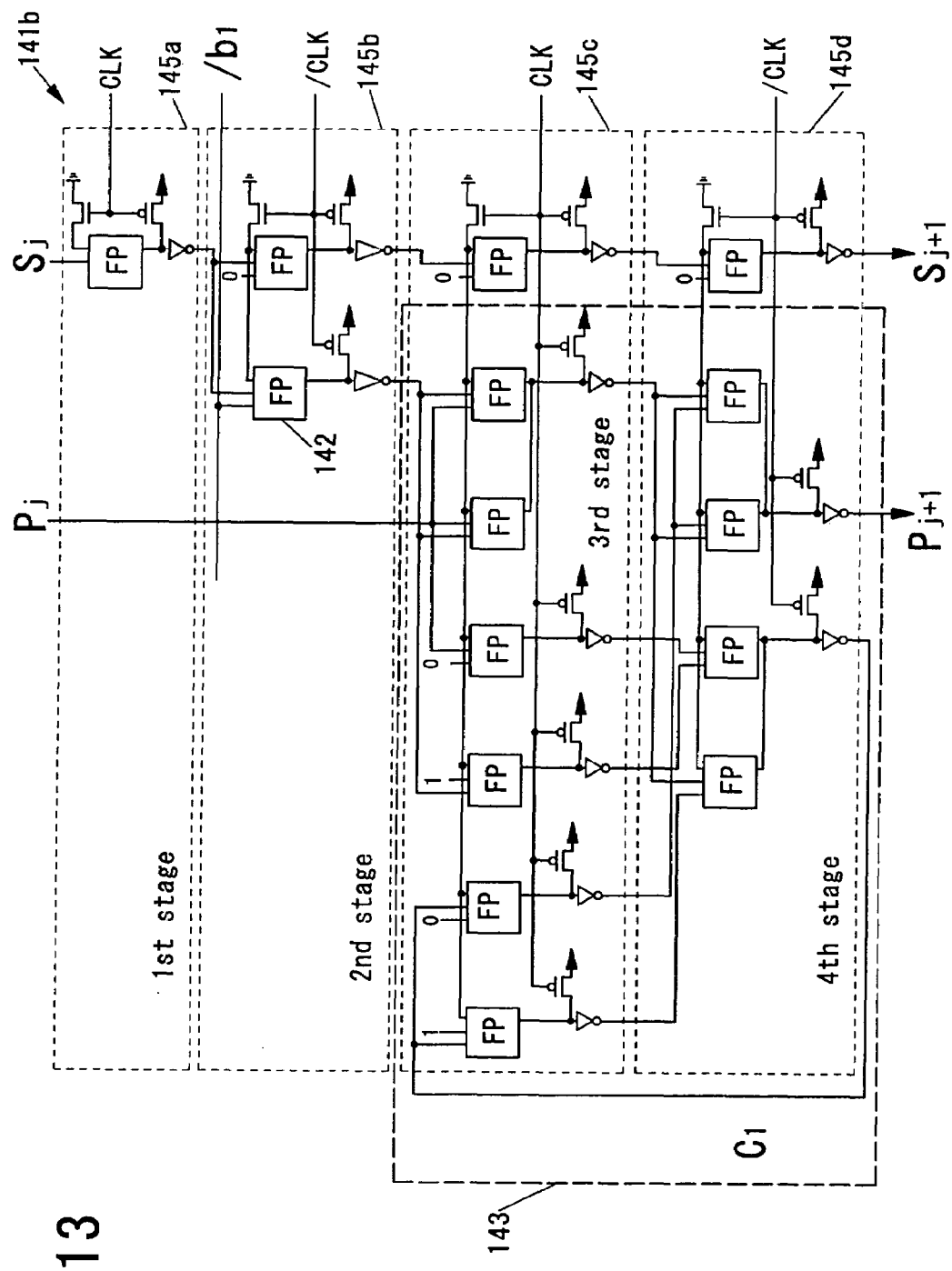
FIG. 13 is a block diagram illustrating the constitution of the second level operation section 141b of the pipeline multiplier 141.
Figure 14:
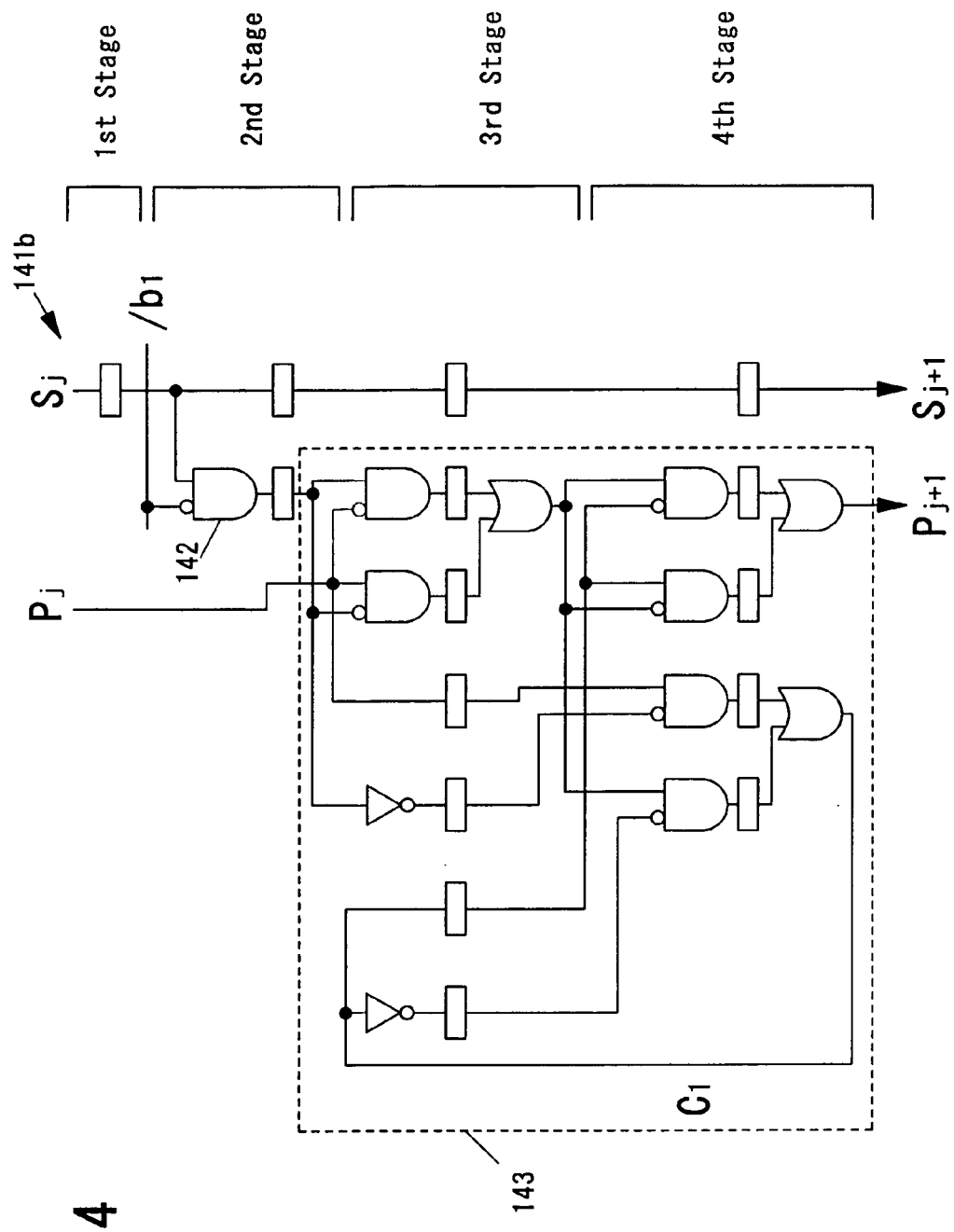
FIG. 14 is a logical circuit diagram illustrating the constitution of the second level operation section 141b.

FIG. 13 is a block diagram illustrating the constitution of the second level operation section 141b of the pipeline multiplier 141. FIG. 14 is a logical circuit diagram illustrating the constitution of the second level operation section 141b. Each of small and wide rectangles in FIG. 14 represents a storage section. The second level operation section 141b is configured to divide the operation of the second level into four stages and execute them in sequence.

As shown in FIG. 13, the second level operation section 141b has first to fourth stage operation sections 145a to 145d for performing the operations of the first to fourth stages, respectively. In the drawing, each "FP" with a square around it represents the logical operation circuit 1 (functional pass gate) shown in FIG. 1.

The first stage operation section 145a fetches one bit as the current operation target of the bits constituting the multiplicand "s" and stores it as an operation target multiplicand bit sj.

The second stage operation section 145b calculates and stores the AND of the operation target multiplicand bit sj having been stored in the previous stage and a bit b1 corresponding to the second level of the bits constituting the multiplier "b" as an element partial product of the operation target multiplicand bit sj in the second level using the AND circuit 142, and fetches and stores the operation target multiplicand bit sj having been stored in the first stage.

The third and fourth stage operation sections 145c and 145d calculate the sum of three binary numbers: a partial product in the second level calculated in the previous stage, a partial product Pj in the first level, and a carry C1 of the bit before the operation target multiplicand bit sj in the second level and stores it as a partial product Pj+1 of the operation target multiplicand bit sj in the second level, and store a new carry generated by the addition as a carry of the operation target multiplicand bit sj in the second level, using the pipeline full adder 143.

The third and fourth stage operation sections 145c and 145d also fetch the operation target multiplicand bit sj having been stored in the second stage and stores it as an operation target multiplicand bit sj+1 for the third level as the next level.

The third and fourth level operation sections 141c and 141d have the same constitution as the second level operation section 141b. The first level operation section 141a, however, does not have a logical operation circuit for performing a full addition.

The pipeline full adder 143 shown in FIG. 13 may be considered as a logical operation device for performing operations of first and second addition stages corresponding to the third and fourth stages, respectively. In this case, the pipeline full adder 143 has first and second addition stage operation sections for performing the first and second addition stage operations, respectively.

The first and second addition stage operation sections constituting the pipeline full adder 143 are circuits obtained by removing, from the third and fourth level operation sections 145c and 145d, the logical operation circuits 1 (functional pass gates) at the right-hand end of FIG. 13.

That is, the first addition stage operation section calculates and stores a binary number corresponding to the exclusive OR of binary numbers corresponding to an augend and an addend as a first addition result using a pair of logical operation circuits 1 connected in parallel, and stores a carry outputted in the immediately previously performed second addition stage.

The second addition stage operation section calculates and stores a binary number corresponding to the exclusive OR of the first addition result calculated in the first addition stage and a binary number corresponding to the carry having been stored in the first addition stage as a second addition result and outputs the second additions result as the addition result of the pipeline full adder 143 using another pair of logical operation circuits 1 connected in parallel, and calculates and stores the carry of the addition using a plurality of logical operation circuits 1.

Although only a ferroelectric capacitor is used as a load element in the above embodiments, this invention is not limited thereto. For example, a ferroelectric capacitor may be used in combination with another electric element such as a paraelectric capacitor, resistor or transistor as a load element.

Although the output transistor is an N-channel MOSFET in the above embodiments, this invention is not limited thereto. For example, this invention is applicable when the transistor MP is a P-channel MOSFET. Also, this invention is applicable when the output transistor is a transistor other than a MOSFET or when the operation result output section does not have an output transistor.

Although only a ferroelectric capacitor is used as a non-volatile memory element in the above embodiments, this invention is not limited thereto. For example, a ferroelectric capacitor may be used in combination with another electric element such as a paraelectric capacitor, resistor or transistor as a non-volatile memory element.

A logical operation circuit according to this invention comprises: a first ferroelectric capacitor which can retain a polarization state corresponding to a specified logical operator and which has first and second terminals; first and second signal lines which can provide first and second operation target data to the first and second terminals, respectively, of the first ferroelectric capacitor retaining the polarization state corresponding to the specified logical operator and which are connected to the first and second terminals, respectively; and an operation result output section which, when the residual polarization state of the first ferroelectric capacitor determined by the provision of the two operation target data is either a first residual polarization state or a second residual polarization state having a polarization direction opposite that of the first residual polarization state, outputs the result of a logical operation performed on the first and second operation target data according to the logical operator based on the residual polarization state of the first ferroelectric capacitor.

The operation result output section has a second ferroelectric capacitor having a third terminal connected to the first signal line and a fourth terminal connected to a first reference potential, and, when outputting the logical operation result, connects the first and second signal lines to the first reference potential and releases the connection, then connects the second signal line to a second reference potential, and outputs the logical operation result based on a potential generated in the first signal line when the second signal line is connected to the second reference potential.

The area ratio Ra of the area of the second ferroelectric capacitor to the area of the first ferroelectric capacitor satisfies the following relation:

$$1/(1+C0/C1-Ra)-1/(1+Ra) \geq 0.75 \cdot (1/(1+\sqrt{(C0/C1)})-1/(1+\sqrt{(C1/C0)}))$$

wherein $C0$: the first ferroelectric capacitor's average capacitance at the time of non-inversion, and $C1$: the first ferroelectric capacitor's average capacitance at the time of inversion.

Thus, according to the above logical operation circuit, when a residual polarization state of the first ferroelectric capacitor and the result of a logical operation are associated with each other, it is possible to obtain, based on a new residual polarization state of the first ferroelectric capacitor obtained by providing the first and second operation target data to the first ferroelectric capacitor holding a polarization state corresponding to a specified logical operator, the result of the logical operation performed on the first and second operation target data according to the logical operator. That is, a logical operation can be performed on data using a ferroelectric capacitor. Also, when the ratio Ra of the area of the second ferroelectric capacitor to the area of the first ferroelectric capacitor is set to a value in a specified range, the output voltage detection margin in reading out the logical operation result can be large. Thus, the logical operation can be performed at a high speed.

In the logical operation circuit according to this invention, the first and second signal lines are connected to one of the first and second potential and the other of the first and second potential, respectively, to generate the polarization state corresponding to the logical operator in the first ferroelectric capacitor before the first and second operation target data are provided.

Thus, a desired logical operator can be stored in the ferroelectric capacitor via the first and second signal lines. Therefore, the logical operator, as well as the first and second operation target data, can be rewritten as needed. That is, a desired logical operation can be performed on any two data at a high speed.

In the logical operation circuit according to this invention, the operation result output section has an output transistor having a control terminal connected to the first signal line and an output terminal for outputting an output signal corresponding to a control signal inputted into the control terminal. The output transistor has a threshold voltage between two potentials corresponding to the first and second residual polarization states in the first ferroelectric capacitor, which are generated in the first signal line during a logical operation.

Thus, the logical operation result retained as a first or second residual polarization state of the first ferroelectric capacitor can be obtained directly in the form of the on or off state of the output transistor. It is, therefore, possible to realize a compact and high-speed logical operation circuit which requires no sense amplifier.

In the logical operation circuit according to this invention, the threshold voltage of the output transistor is generally intermediate between two potentials corresponding to the first and second residual polarization states in the first ferroelectric capacitor, which are generated in the first signal line during a logical operation.

Thus, the operation margin of the output transistor in detecting the logical operation result is maximum. Therefore, a logical operation can be performed with further reliability at a higher speed.

A logical operation circuit according to this invention comprises: a first ferroelectric capacitor which retains a residual polarization state corresponding to a specified logical operator and which has first and second terminals; and an operation result output section which, based on a polarization state of the first ferroelectric capacitor obtained by providing first and second operation target binary data y1 and y2 to first and second terminals, respectively, of the first ferroelectric capacitor, outputs the result of a logical operation performed on the first and second operation target data y1 and y2 according to the logical operator as operation result binary data "z".

The operation result output section has a second ferroelectric capacitor having a third terminal connected to the first terminal and a fourth terminal connected to a first reference potential.

The operation result output section connects the first to third terminals to the first reference potential and releases the connection, then connects the second terminal to a second reference potential, and outputs the logical operation result based on a potential generated in the first and third terminals when the second terminal is connected to the second reference potential.

The area ratio Ra of the area of the second ferroelectric capacitor to the area of the first ferroelectric capacitor satisfies the following relation:

$$1/(1+C0/C1 \cdot Ra)-1/(1+Ra) \geq 0.75 \cdot (1/(1+\sqrt{(C0/C1)})-1/(1+\sqrt{(C1/C0)}))$$

wherein

C0: the first ferroelectric capacitor's average capacitance at the time of non-inversion, and C1: the first ferroelectric capacitor's average capacitance at the time of inversion.

When the residual polarization state of the first ferroelectric capacitor corresponding to the specified logical operator is represented by state binary data "s", the operation result data "z" substantially satisfies the following relation:

z=/s AND y1 NAND /y2 OR s AND (y1 NOR /y2)

Thus, when a polarization state of the first ferroelectric capacitor and the operation result data "z" are associated with each other, it is possible to obtain, based on a new polarization state of the first ferroelectric capacitor which can be obtained by providing the first and second operation target data y1 and y2 to the first ferroelectric capacitor retaining a residual polarization state "s" corresponding to a specified logical operator, the result "z" of a logical operation performed on the first and second operation target data y1 and y2 according to the logical operator. That is, a logical operation can be performed on data using a ferroelectric capacitor. Also, when the ratio Ra of the area of the second ferroelectric capacitor to the area of the first ferroelectric capacitor is set to a value in a specified range, the output voltage detection margin in reading out the logical operation result can be large. Thus, the logical operation can be performed at a high speed.

A logical operation circuit according to this invention comprises: a first ferroelectric capacitor having first and second terminals; and a second ferroelectric capacitor having a third terminal connected to the first terminal and a fourth terminal connected to a first reference potential. In the logical operation circuit, the first and second ferroelectric capacitors are precharged to the first reference potential and then the fourth and second terminals are connected to the first reference potential and a second reference potential, respectively, so that a logical operation result corresponding to the history of the voltage applied to the first and second terminals before the precharging can be outputted based on a potential generated at the first and third terminals connected to each other when the fourth and second terminals are connected to the first and second reference potentials, respectively.

The ratio R of the second ferroelectric capacitor's average capacitance at the time of non-inversion to the first ferroelectric capacitor's average capacitance at the time of non-inversion satisfies the following relation:

$$1/(1+C0/C1 \cdot R)-1/(1+R) \geq 0.75 \cdot (1/(1+\sqrt{(C0/C1)})-1/(1+\sqrt{(C1/C0)}))$$

wherein

C0: the first ferroelectric capacitor's average capacitance at the time of non-inversion, and C1: the first ferroelectric capacitor's average capacitance at the time of inversion.

Thus, when voltages corresponding to the logical operator and the operation target data are applied to the first and second terminals in sequence before the precharge, it is possible to obtain the result of a logical operation performed on the operation target data according to the logical operator. That is, a logical operation can be performed using ferroelectric capacitors. Also, when the ratio R of the second ferroelectric capacitor's average capacitance at the time of non-inversion to the first ferroelectric capacitor's average capacitance at the time of non-inversion is set to a value in a specified range, the output voltage detection margin in reading out the logical operation result can be large. Thus, the logical operation can be performed at a high speed.

A logical operation device according to this invention comprising a plurality of logical operation circuits of any of the above types which are arranged in series and/or parallel to perform a desired logical operation.

Since a multiplicity of the logical operation circuits, each of which can serve as a logical operation section and a storage section, are combined to perform a desired logical operation, the circuit area of the logical operation device, including the area for wiring, can be much smaller than that of a conventional logical operation device having a separate storage section. Thus, the degree of integration in the device can be highly increased, and the power consumption of the device can be reduced. Also, since the storage is non-volatile, no power is required to maintain the storage. Thus, power consumption during operation can be reduced, and little power is consumed during standby. Also, there is no need for a backup power source for power shutdown. That is, it is possible to realize a low-power consumption, space-saving, and high-speed logical operation device.

A logical operation device according to this invention comprises a plurality of logical operation circuits of any of the above types which are arranged in series and/or parallel to perform an addition of at least two binary numbers.

Since an adder is constituted of a multiplicity of the logical operation circuits, each of which serves as a logical operation section and a storage section, the circuit area of the adder, including the area for wiring, can be much smaller than that of a conventional adder. Thus, the degree of integration in the device can be highly increased, and the power consumption of the device can be reduced. Also, since the storage is non-volatile, no power is required to retain the storage. Thus, power consumption during operation can be reduced, and little power is consumed during standby. Also, there is no need for a backup power source for power shutdown. That is, it is possible to realize a low-power consumption, space-saving, and high-speed adder.

In the logical operation device according to this invention, at least two binary numbers are three binary numbers: an augend, an adder and a carry from a lower bit. The logical operation device further comprises: an addition result calculation section for calculating the result of an addition of the three binary numbers; and a carry calculation section for calculating the carry of the addition of the three binary numbers. The addition result calculation section calculates a binary number corresponding to the exclusive OR of binary numbers corresponding to two of the three binary numbers as a first addition result using a pair of the logical operation circuits connected in parallel, calculates a binary number corresponding to the exclusive OR of the first addition result and a binary number corresponding to the other of the three binary numbers as a second addition result using another pair of the logical operation circuits, and provides the second addition result as its output. The carry calculation section calculates the carry of the addition of the three binary numbers based on the three binary numbers using a plurality of the logical operation circuits, and provides the calculated carry as its output.

Thus, a full adder can be constituted of two pair of logical operation circuits for calculating and storing an addition result and a plurality of logical operation circuits for calculating and storing a carry. Thus, it is possible to realize a highly-integrated, low-power consumption, and high-speed full adder with ease.

A logical operation device according to this invention comprises a plurality of logical operation circuits of any of the above types which are arranged in series and/or parallel to perform a logical operation, in which the logical operation is divided into a plurality of stages, which are executed in sequence.

Since each of the stages is constituted of a multiplicity of the logical operation circuits, each of which serves as a logical operation section and a storage section, the circuit area of the logical operation device, including the area for wiring, can be much smaller than that of a conventional pipeline logical operation device. Thus, the degree of integration in the device can be highly increased, and the power consumption of the device can be reduced. Also, since the storage is non-volatile, no power is required to retain the storage. Thus, power consumption during operation can be reduced, and little power is consumed during standby. Also, there is no need for a backup power source for power shutdown. That is, it is possible to realize a low-power consumption, space-saving, and high-speed pipeline logical operation device.

In the logical operation device according to this invention, the logical operation includes an addition of three binary numbers: an augend, an adder and a carry from a lower bit. The logical operation device further comprises: a first addition stage operation section for performing a first addition stage operation including a process of calculating and storing a binary number corresponding to the exclusive OR of binary numbers corresponding to two of the three binary numbers as a first addition result using a pair of the logical operation circuits connected in parallel; and a second addition stage operation section for performing, subsequently to the first addition stage operation, a second addition stage operation including a process of calculating and storing a binary number corresponding to the exclusive OR of the first addition result and a binary number corresponding to the other of the three binary numbers as a second addition result and outputting the second addition result as the result of addition of the logical operation device using another pair of the logical operation circuits connected in parallel, and a process of outputting the carry of the addition of the three binary numbers based on the three binary numbers using a plurality of the logical operation circuits.

Thus, a pipeline full adder can be constituted when two pairs of logical operation circuits for calculating an addition result and a plurality of logical operation circuits for calculating a carry which are disposed separately in two stage operation sections. It is, therefore, possible to constitute a highly-integrated, low-power consumption, and high-speed pipeline full adder with ease.

A logical operation device according to this invention is a logical operation device for dividing a multiplication of two binary numbers into a plurality of levels and performing them in sequence, and comprises: a partial product generation sections for generating a partial product of a multiplicand and a multiplier; and an addition section including a plurality of logical operation devices as described above, as element operation devices, which are arranged in a plurality of stages corresponding to the plurality of levels and which receive the partial product and/or the addition result in the previous stage and perform additions in sequence to obtain an operation result.

Thus, a pipelined multiplier can be constituted when the above pipelined full adders as element operation devices are arranged in a plurality of stages corresponding to the levels of the multiplication. It is, therefore, possible to constitute a highly-integrated, low-power consumption, and high-speed pipeline multiplier with ease.

In the logical operation device according to this invention, the number of the levels is the same as the bit number of the multiplier or more, the partial product generation section is constituted of element partial product generation sections located in level operation sections each for performing an operation of each level, and the addition section is constituted of the element operation devices located in level operation sections for performing the operations of at least the second level and later. Each of the level operation sections for performing the operations of at least the second level and later has first to third stage operation sections. The first stage operation section performs a first stage operation including a process of storing one bit of bits constituting the multiplicand which is the target of the current operation as an operation target multiplicand bit. The second stage operation section performs, subsequently to the first stage operation, a second stage operation including a process of calculating and storing the AND of the operation target multiplicand bit and a bit corresponding to the pertinent level of the bits constituting the multiplier as an element partial product of the operation target multiplicand bit in the pertinent level using the element partial product generation section. The third and fourth stage operation sections performs, subsequently to the second stage operation, third and fourth stage operations respectively, including a process of calculating the sum of three binary numbers: an element partial product in the pertinent level, a partial product in the previous level and a carry of the bit before the operation target multiplicand bit in the pertinent level and storing it as a partial product of the operation target multiplicand bit in the pertinent level, and a process of storing the carry generated by the addition as a carry of the operation target multiplicand bit in the pertinent level.

Thus, a series-parallel pipeline multiplier can be constituted by giving a corresponding bit value to each of the level operation sections corresponding in number to the bit number of the multiplier, giving the bit values of the multiplicand to the first level operation section in sequence, and giving the bit values of the multiplicand to each of the level operations sections of intermediate levels from a previous level operation section in sequence with a specified delay. It is, therefore, possible to constitute a highly-integrated, low-power consumption, and high-speed pipeline multiplier with ease.

While this invention has been described in its preferred embodiments, it is understood that the terminology employed herein is for the purpose of description and not of limitation and that changes and variations may be made without departing from the spirit and scope of the appended claims.

What is claimed is:

1. A logical operation circuit comprising:
a first ferroelectric capacitor which can retain a polarization state corresponding to a specified logical operator and which has first and second terminals;
first and second signal lines which can provide first and second operation target data to the first and second terminals, respectively, of the first ferroelectric capacitor retaining the polarization state corresponding to the specified logical operator and which are connected to the first and second terminals, respectively; and
an operation result output section which, when a residual polarization state of the first ferroelectric capacitor determined by the provision of the two operation target data is either a first residual polarization state or a second residual polarization state having a polarization direction opposite that of the first residual polarization state, outputs the result of a logical operation performed on the first and second operation target data according to the logical operator based on the residual polarization state of the first ferroelectric capacitor, which has a second ferroelectric capacitor having a third terminal connected to the first signal line and a fourth terminal connected to a first reference potential, and which, when outputting the logical operation result, connects the first and second signal lines to the first reference potential and releases the connection, then connects the second signal line to a second reference potential, and outputs the logical operation result based on a potential generated in the first signal line when the second signal line is connected to the second reference potential,
wherein the area ratio Ra of the area of the second ferroelectric capacitor to the area of the first ferroelectric capacitor satisfies the following relation:

$$1/(1+C0/C1\cdot Ra)-1/(1+Ra) \geq 0.75\cdot(1/(1+\sqrt{(C0/C1)})-1/(1+\sqrt{(C1/C0)}))$$

wherein
C0: the first ferroelectric capacitor's average capacitance at the time of non-inversion, and
C1: the first ferroelectric capacitor's average capacitance at the time of inversion.

2. The logical operation circuit as set forth in claim 1, wherein the first and second signal lines are connected to one of the first and second potential and the other of the first and second potential, respectively, to generate the polarization state corresponding to the logical operator in the first ferroelectric capacitor before the first and second operation target data are provided.

3. The logical operation circuit as set forth in claim 1, wherein the operation result output section has an output transistor having a control terminal connected to the first signal line and an output terminal for outputting an output signal corresponding to a control signal inputted into the control terminal, and having a threshold voltage between two potentials corresponding to the first and second residual polarization states in the first ferroelectric capacitor respectively, which are generated in the first signal line during a logical operation.

4. The logical operation circuit as set forth in claim 3, wherein the threshold voltage of the output transistor is generally intermediate between two potentials corresponding to the first and second residual polarization states in the first ferroelectric capacitor, which are generated in the first signal line during a logical operation.

5. A logical operation device comprising a plurality of logical operation circuits according to claim 1 which are arranged in series and/or parallel to perform a desired logical operation.

6. A logical operation device comprising a plurality of logical operation circuits according to claim 1 which are arranged in series and/or parallel to perform an addition of at least two binary numbers.

7. The logical operation device as set forth in claim 6,
wherein at least two binary numbers are three binary numbers: an augend, an adder and a carry from a lower bit,
the logical operation device further comprising an addition result calculation section for calculating the result of an addition of the three binary numbers and a carry calculation section for calculating the carry of the addition of the three binary numbers,
wherein the addition result calculation section calculates a binary number corresponding to the exclusive OR of binary numbers corresponding to two of the three binary numbers as a first addition result using a pair of the logical operation circuits connected in parallel, calculates a binary number corresponding to the exclusive OR of the first addition result and a binary number corresponding to the other of the three binary numbers as a second addition result using another pair of the logical operation circuits, and provides the second addition result as its output, and
wherein the carry calculation section calculates the carry of the addition of the three binary numbers based on the three binary numbers using a plurality of the logical operation circuits, and provides the calculated carry as its output.

8. The logical operation device as set forth in claim 6,
wherein the logical operation includes an addition of three binary numbers: an augend, an adder and a carry from a lower bit,
the logical operation device further comprising:
a first addition stage operation section for performing a first addition stage operation including a process of calculating and storing a binary number corresponding to the exclusive OR of binary numbers corresponding to two of the three binary numbers as a first addition result using a pair of the logical operation circuits connected in parallel; and
a second addition stage operation section for performing, subsequently to the first addition stage operation, a second addition stage operation including a process of calculating and storing a binary number corresponding to the exclusive OR of the first addition result and a binary number corresponding to the other of the three binary numbers as a second addition result and outputting the second addition result as the result of addition of the logical operation device using another pair of the logical operation circuits connected in parallel, and a process of outputting the carry of the addition of the three binary numbers based on the three binary numbers using a plurality of the logical operation circuits.

9. A logical operation device for dividing a multiplication of two binary numbers into a plurality of levels and performing them in sequence, comprising:
   a partial product generation section for generating a partial product of a multiplicand and a multiplier; and
   an addition section including a plurality of logical operation devices according to claim 8, as element operation devices, which are arranged in a plurality of stages corresponding to the plurality of levels and which receive the partial product and/or the addition result in the previous stage and perform additions in sequence to obtain an operation result.

10. The logical operation device as set forth in claim 9,
   wherein the number of the levels is the same as the bit number of the multiplier or more,
   wherein the partial product generation section is constituted of element partial product generation sections located in level operation sections each for performing an operation of each level, and
   wherein the addition section is constituted of the element operation devices located in level operation sections for performing the operations of at least the second level and later,
   each of the level operation sections for performing the operations of at least the second level and later having:
   a first stage operation section for performing a first stage operation including a process of storing one bit, which is the target of the current operation, of the bits constituting the multiplicand as an operation target multiplicand bit;
   a second stage operation section for performing, subsequently to the first stage operation, a second stage operation including a process of calculating and storing the AND of the operation target multiplicand bit and a bit corresponding to the pertinent level of the bits constituting the multiplier as an element partial product of the operation target multiplicand bit in the pertinent level using the element partial product generation section, and
   third and fourth stage operation sections for performing, subsequently to the second stage operation, third and fourth stage operations respectively, including a process of calculating the sum of three binary numbers: an element partial product in the pertinent level, a partial product in the previous level and a carry of the bit before the operation target multiplicand bit in the pertinent level and storing it as a partial product of the operation target multiplicand bit in the pertinent level, and a process of storing the carry generated by the addition as a carry of the operation target multiplicand bit in the pertinent level.

11. A logical operation device comprising a plurality of logical operation circuits according to claim 1 which are arranged in series and/or parallel to perform a logical operation,
   wherein the logical operation is divided into a plurality of stages, which are executed in sequence.

12. A logical operation circuit comprising:
   a first ferroelectric capacitor which retains a residual polarization state corresponding to a specified logical operator and which has first and second terminals; and
   an operation result output section which, based on a polarization state of the first ferroelectric capacitor obtained by providing first and second operation target binary data $y1$ and $y2$ to first and second terminals, respectively, of the first ferroelectric capacitor, outputs the result of a logical operation performed on the first and second operation target data $y1$ and $y2$ according to the logical operator as operation result binary data "z", which has a second ferroelectric capacitor having a third terminal connected to the first terminal and a fourth terminal connected to a first reference potential, and which, when outputting the logical operation result, connects the first to third terminals to the first reference potential and releases the connection, then connects the second terminal to a second reference potential, and outputs the logical operation result based on a potential generated in the first and third terminals when the second terminal is connected to the second reference potential,
   wherein the area ratio Ra of the area of the second ferroelectric capacitor to the area of the first ferroelectric capacitor satisfies the following relation:

$$1/(1+C0/C1\cdot Ra)-1/(1+Ra) \geqq 0.75\cdot(1/(1+\sqrt{(C0/C1)})-1/(1+\sqrt{(C1/C0)}))$$

wherein
   C0: the first ferroelectric capacitor's average capacitance at the time of non-inversion, and
   C1: the first ferroelectric capacitor's average capacitance at the time of inversion, and
   wherein, when the residual polarization state of the first ferroelectric capacitor corresponding to the specified logical operator is represented by state binary data "s", the operation result data "z" substantially satisfies the following relation:

$$z = /s \text{ AND } y1 \text{ NAND } /y2 \text{ OR } s \text{ AND } (y1 \text{ NOR } /y2).$$

13. A logical operation device comprising a plurality of logical operation circuits according to claim 12 which are arranged in series and/or parallel to perform a desired logical operation.

14. A logical operation device comprising a plurality of logical operation circuits according to claim 12 which are arranged in series and/or parallel to perform an addition of at least two binary numbers.

15. The logical operation device as set forth in claim 14,
   wherein at least two binary numbers are three binary numbers: an augend, an adder and a carry from a lower bit,
   the logical operation device further comprising an addition result calculation section for calculating the result of an addition of the three binary numbers and a carry calculation section for calculating the carry of the addition of the three binary numbers,
   wherein the addition result calculation section calculates a binary number corresponding to the exclusive OR of binary numbers corresponding to two of the three binary numbers as a first addition result using a pair of the logical operation circuits connected in parallel, calculates a binary number corresponding to the exclusive OR of the first addition result and a binary number corresponding to the other of the three binary numbers as a second addition result using another pair of the logical operation circuits, and provides the second addition result as its output, and
   wherein the carry calculation section calculates the carry of the addition of the three binary numbers based on the three binary numbers using a plurality of the logical operation circuits, and provides the calculated carry as its output.

16. A logical operation device comprising a plurality of logical operation circuits according to claim 12 which are arranged in series and/or parallel to perform a logical operation,
   wherein the logical operation is divided into a plurality of stages, which are executed in sequence.

17. The logical operation device as set forth in claim 14,
wherein the logical operation includes an addition of three binary numbers: an augend, an adder and a carry from a lower bit, the logical operation device further comprising:
a first addition stage operation section for performing a first addition stage operation including a process of calculating and storing a binary number corresponding to the exclusive OR of binary numbers corresponding to two of the three binary numbers as a first addition result using a pair of the logical operation circuits connected in parallel; and
a second addition stage operation section for performing, subsequently to the first addition stage operation, a second addition stage operation including a process of calculating and storing a binary number corresponding to the exclusive OR of the first addition result and a binary number corresponding to the other of the three binary numbers as a second addition result and outputting the second addition result as the result of addition of the logical operation device using another pair of the logical operation circuits connected in parallel, and a process of outputting the carry of the addition of the three binary numbers based on the three binary numbers using a plurality of the logical operation circuits.

18. A logical operation device for dividing a multiplication of two binary numbers into a plurality of levels and performing them in sequence, comprising:
a partial product generation section for generating a partial product of a multiplicand and a multiplier; and
an addition section including a plurality of logical operation devices according to claim 17, as element operation devices, which are arranged in a plurality of stages corresponding to the plurality of levels and which receive the partial product and/or the addition result in the previous stage and perform additions in sequence to obtain an operation result.

19. The logical operation device as set forth in claim 18,
wherein the number of the levels is the same as the bit number of the multiplier or more,
wherein the partial product generation section is constituted of element partial product generation sections located in level operation sections each for performing an operation of each level, and
wherein the addition section is constituted of the element operation devices located in level operation sections for performing the operations of at least the second level and later,
each of the level operation sections for performing the operations of at least the second level and later having:
a first stage operation section for performing a first stage operation including a process of storing one bit, which is the target of the current operation, of the bits constituting the multiplicand as an operation target multiplicand bit;
a second stage operation section for performing, subsequently to the first stage operation, a second stage operation including a process of calculating and storing the AND of the operation target multiplicand bit and a bit corresponding to the pertinent level of the bits constituting the multiplier as an element partial product of the operation target multiplicand bit in the pertinent level using the element partial product generation section, and
third and fourth stage operation sections for performing, subsequently to the second stage operation, third and fourth stage operations respectively, including a process of calculating the sum of three binary numbers: an element partial product in the pertinent level, a partial product in the previous level and a carry of the bit before the operation target multiplicand bit in the pertinent level and storing it as a partial product of the operation target multiplicand bit in the pertinent level, and a process of storing the carry generated by the addition as a carry of the operation target multiplicand bit in the pertinent level.

20. A logical operation circuit comprising:
a first ferroelectric capacitor having first and second terminals; and
a second ferroelectric capacitor having a third terminal connected to the first terminal and a fourth terminal connected to a first reference potential,
wherein the first and second ferroelectric capacitors are precharged to the first reference potential and then the fourth and second terminals are connected to the first reference potential and a second reference potential, respectively, so that a logical operation result corresponding to the history of the voltage applied to the first and second terminals before the precharging can be outputted based on a potential generated at the first and third terminals connected to each other when the fourth and second terminals are connected to the first and second reference potentials, respectively, and
wherein the ratio R of the second ferroelectric capacitor's average capacitance at the time of non-inversion to the first ferroelectric capacitor's average capacitance at the time of non-inversion satisfies the following relation:

$$1/(1+C0/C1 \cdot R) - 1/(1+R) \geq 0.75 \cdot (1/(1+\sqrt{(C0/C1)}) - 1/(1+\sqrt{(C1/C0)}))$$

wherein
C0: the first ferroelectric capacitor's average capacitance at the time of non-inversion, and
C1: the first ferroelectric capacitor's average capacitance at the time of inversion.

21. A logical operation device comprising a plurality of logical operation circuits according to claim 20 which are arranged in series and/or parallel to perform a desired logical operation.

22. A logical operation device comprising a plurality of logical operation circuits according to claim 20 which are arranged in series and/or parallel to perform an addition of at least two binary numbers.

23. The logical operation device as set forth in claim 22,
wherein at least two binary numbers are three binary numbers: an augend, an adder and a carry from a lower bit,
the logical operation device further comprising an addition result calculation section for calculating the result of an addition of the three binary numbers and a carry calculation section for calculating the carry of the addition of the three binary numbers,
wherein the addition result calculation section calculates a binary number corresponding to the exclusive OR of binary numbers corresponding to two of the three binary numbers as a first addition result using a pair of the logical operation circuits connected in parallel, calculates a binary number corresponding to the exclusive OR of the first addition result and a binary number corresponding to the other of the three binary numbers as a second addition result using another pair of the logical operation circuits, and provides the second addition result as its output, and
wherein the carry calculation section calculates the carry of the addition of the three binary numbers based on the three binary numbers using a plurality of the logical operation circuits, and provides the calculated carry as its output.

24. The logical operation device as set forth in claim 22, wherein the logical operation includes an addition of three binary numbers: an augend, an adder and a carry from a lower bit, the logical operation device further comprising:

a first addition stage operation section for performing a first addition stage operation including a process of calculating and storing a binary number corresponding to the exclusive OR of binary numbers corresponding to two of the three binary numbers as a first addition result using a pair of the logical operation circuits connected in parallel; and a second addition stage operation section for performing, subsequently to the first addition stage operation, a second addition stage operation including a process of calculating and storing a binary number corresponding to the exclusive OR of the first addition result and a binary number corresponding to the other of the three binary numbers as a second addition result and outputting the second addition result as the result of addition of the logical operation device using another pair of the logical operation circuits connected in parallel, and a process of outputting the carry of the addition of the three binary numbers based on the three binary numbers using a plurality of the logical operation circuits.

25. A logical operation device for dividing a multiplication of two binary numbers into a plurality of levels and performing them in sequence, comprising:

a partial product generation section for generating a partial product of a multiplicand and a multiplier; and an addition section including a plurality of logical operation devices according to claim 24, as element operation devices, which are arranged in a plurality of stages corresponding to the plurality of levels and which receive the partial product and/or the addition result in the previous stage and perform additions in sequence to obtain an operation result.

26. The logical operation device as set forth in claim 25, wherein the number of the levels is the same as the bit number of the multiplier or more, wherein the partial product generation section is constituted of element partial product generation sections located in level operation sections each for performing an operation of each level, and wherein the addition section is constituted of the element operation devices located in level operation sections for performing the operations of at least the second level and later, each of the level operation sections for performing the operations of at least the second level and later having:

a first stage operation section for performing a first stage operation including a process of storing one bit of bits constituting the multiplicand which is the target of the current operation as an operation target multiplicand bit;

a second stage operation section for performing, subsequently to the first stage operation, a second stage operation including a process of calculating and storing the AND of the operation target multiplicand bit and a bit corresponding to the pertinent level of the bits constituting the multiplier as an element partial product of the operation target multiplicand bit in the pertinent level using the element partial product generation section, and third and fourth stage operation sections for performing, subsequently to the second stage operation, third and fourth stage operations respectively, including a process of calculating the sum of three binary numbers: an element partial product in the pertinent level, a partial product in the previous level and a carry of the bit before the operation target multiplicand bit in the pertinent level and storing it as a partial product of the operation target multiplicand bit in the pertinent level, and a process of storing the carry generated by the addition as a carry of the operation target multiplicand bit in the pertinent level.

27. A logical operation device comprising a plurality of logical operation circuits according to claim 20 which are arranged in series and/or parallel to perform a logical operation, wherein the logical operation is divided into a plurality of stages, which are executed in sequence.

* * * * *